United States Patent [19]

Hatamura et al.

[11] Patent Number: 4,686,440

[45] Date of Patent: Aug. 11, 1987

[54] FINE POSITIONING DEVICE

[75] Inventors: Yotaro Hatamura, 12-11, Kohinata 2-chome, Bunkyo-ku, Tokyo; Kozo Ono, Toride, both of Japan

[73] Assignees: Yotaro Hatamura; Hitachi Construction Machinery Co., Ltd., both of Tokyo, Japan

[21] Appl. No.: 824,958

[22] Filed: Jan. 31, 1986

[30] Foreign Application Priority Data

Mar. 11, 1985 [JP]  Japan ................................ 60-46443
Apr. 20, 1985 [JP]  Japan ................................ 60-83605

[51] Int. Cl.$^4$ ...................... G05D 15/00; G05B 11/01
[52] U.S. Cl. .................................. 318/646; 318/116; 318/687; 318/638; 310/317
[58] Field of Search ............... 318/638, 488, 646, 116, 318/117, 653, 640, 687, 648, 560; 310/370, 367, 368, 369, 316, 317, 318, 319; 29/569 R, 571; 356/147, 399

[56] References Cited

U.S. PATENT DOCUMENTS 4,019,109 4/1977 McCoy ................................ 318/640
4,087,729 5/1978 Yamazaki ........................... 318/640

Primary Examiner—William M. Shoop, Jr.
Assistant Examiner—Patrick C. Keane
Attorney, Agent, or Firm—Oblon, Fisher, Spivak, McClelland, & Maier

[57] ABSTRACT

A fine positioning device is constructed of a parallel flexible-beam displacement mechanism and/or a radial flexible-beam displacement mechanism. The former displacement mechanism comprises a first rigid portion rigid against forces, a second rigid portion rigid against forces, plural parallel flexible beams connecting the first and second rigid portions together, and a first actuator adapted to have the plural flexible beams undergo bending deformation. The latter displacement mechanism comprises a third rigid portion rigid against torques, a fourth rigid portion rigid against torques, plural radial flexible beams connecting the third and fourth rigid portions together, and a second actuator adapted to have the plural flexible beams undergo bending deformation. The fine positioning device can obtain fine linear displacements and/or fine angular displacement with good accuracy. This invention also facilitates the construction of multi-axis positioning devices.

26 Claims, 28 Drawing Figures

FINE POSITIONING DEVICE

In various fields of technology, there has recently been a strong demand for devices which enable fine adjustment of displacements on the $\mu$m order. As a typical technical field, may be mentioned semiconductor fabrication apparatus employed in the fabrication processes of LSI (large-scale integrated circuits) and super large-scale integrated circuits, such as mask aligners, electron-beam drawing machines and the like. In these apparatus, it is necessary to achieve fine positioning of the $\mu$m order. The degree of integration increases and products of higher performance can be fabricated, as the positioning accuracy is improved. Such fine positioning is required not only for the above-described semiconductor fabrication apparatus but also for a variety of high-magnification optical apparatus, led by electron microscopes, and the like. Improved accuracy contributes significantly to the development of advanced technology such as biotechnology, space development, etc.

As such fine positioning devices, a variety of devices have heretofore been proposed, for example, as shown in a Japanese magazine, "Kikai Sekkei (Machine Designing)", 27 No. 1, 32–36, January 1983. Of such fine positioning devices, those making use of parallel springs and fine motion actuators are considered to be superb in that inter alia, they do not require cumbersome displacement reducing mechanisms and their structures are simple. Accordingly, a fine positioning device of the above sort will hereinafter be described with reference to FIG. 1.

FIG. 1 is a side view of a conventional fine positioning device, in which there are illustrated a support table 1, planar parallel springs 2a–,2b fixed in parallel to each other on the support table 1, and a fine motion table 3 supported on the parallel springs 2a,2b and having a high degree of rigidity. Designated at numeral 4 is a fine motion actuator mounted between the support table 1 and fine motion table 3. The fine motion actuator 4 makes use of a piezoelectric element, an electromagnetic solenoid or the like, which is energized to apply a force to the fine motion table 3 along the x-axis of the coordinate system depicted in the figure.

The parallel springs 2a,2b, reflecting their structure, have low rigidity in the direction of the x-axis but high rigidity in the direction of the z-axis and in the direction of the y-axis (namely, in the direction perpendicular to the drawing sheet). When the fine motion actuator 4 is energized, the fine motion table 3 thus undergoes a displacement practically along the x-axis only and no substantial displacements take place in the other directions.

FIG. 2 is a perspective view of another conventional fine positioning device which is readily conceivable from the devices disclosed by way of example in the above-mentioned magazine. In the figure, there are shown a support plate 6, a pair of planar parallel springs 7a,7b fixed in parallel to each other on the support table 6, a middle table 8 fixed on the parallel springs 7a,7b and having a high degree of rigidity, another pair of parallel springs 9a,9b fixed on the middle table 8 and extending in parallel to each other in a direction perpendicular to the parallel spring 7a,7b, and a fine motion table 10 fixed on the parallel spring 9a,9b and having a high degree of rigidity. When a coordinate system is established as shown in the figure, the parallel spring 7a,7b are arranged along the x-axis, while the parallel springs 9a,9b are disposed along the y-axis. This structure corresponds basically to a structure obtained by stacking two structures, each of the same type as the one-axis (displaceable along the x-axis only) structure depicted in FIG. 1, one over the other. An arrow $F_x$ indicates a force to be applied along the x-axis to the fine motion table 10, while an arrow $F_y$ designates a force to be applied along the y-axis to the middle table 8. Unillustrated actuators which can apply the forces $F_x,F_y$ are provided respectively between the support table 6 and fine motion table 10 and between the support table 6 and the middle table 8.

When the force $F_x$ is applied to the fine motion table 10, the parallel springs 9a,9b are deformed. Since the parallel springs 7a,7b have high rigidity against the force $F_x$ applied along the x-axis, the fine motion table 10 is allowed to undergo a displacement practically along the x-axis only. When the force $F_y$ is exerted to the middle table 8 on the other hand, the parallel springs 7a,7b are deformed and by way of the parallel springs 9a,9b, the fine motion table 10 is displaced practically along the y-axis only. When both forces $F_x,F_y$ are applied at the same time, the parallel springs 7a,7b,9a,9b are simultaneously deformed. Correspondingly, the fine motion table 10 is displaced two-dimensionally.

As described above, the device shown in FIG. 2 can perform positioning along two axes whereas the device illustrated in FIG. 1 is a one-axis positioning device.

The above-described conventional device is however accompanied by the following problems.

(1) The fine motion actuator adapted to produce the force $F_x$ is connected rigidly between the fine motion table 10 and support table 6. When the force $F_y$ is applied to the middle table 8 by the unillustrated fine motion actuator connected rigidly between the middle table 8 and support table 6, the fine motion table 10 is hence displaced along the y-axis. Occurrence of this displacement results in the application of a force, which is perpendicular to the force $F_x$, to the fine motion actuator connected to the fine motion table 10. Consequently, interference is developed between the fine motion actuators. As a result, a problem is developed that the accuracy and durability of the positioning device are adversely affected.

(2) Some detection means may be additionally incorporated in the above-described fine positioning device, whereby simultaneously with a positioning operation, an actual fine displacement is detected and the accuracy of the positioning operation is improved further on the basis of the thus-detected data. Here, the problem (1) develops another problem that a displacement in one direction interferes displacement detection means for another direction and hence reduces the accuracy of detection in the latter direction.

In each of the devices shown respectively in FIGS. 1 and 2, the fine motion table 10 is displaced linearly along the specific axis. On the other hand, Japanese Patent Publication No. 50433/1982 discloses a fine positioning device in which a fine movable table is caused to undergo a fine angular displacement about a specific axis. This fine positioning device will next be described with reference to FIG. 3.

FIG. 3 is a partially cut-away perspective view of a conventional fine positioning device which makes use of fine angular displacements. In the figure, numeral 11 indicates a fixed central portion in the form of a cylindrical column and numerals 11a,11b, 11c designate vertical slots formed with an equal interval, along the length of the fixed central portion, in the circumferential wall of the fixed central portion. There are also depicted a ring-shaped stage 12 provided movably about the fixed central portion 11 and U-like metal members $12a_1$-$12a_3$,$12b_1$-$12b_3$, $12c_1$-$12c_3$ secured fixedly on the stage 12 in opposition to the vertical slots 11a,11b,11c respectively. Designated at numeral 13 are bimorph cells mounted between the individual vertical slots 11a,11b,11c and their corresponding U-like metal members $12a_1$-$12c_3$, while numeral 13A indicates beads fixed on the bimorph cells 13 at locations where the bimorph cells 13 engage their corresponding U-like metal members $12a_1$-$12c_3$. The fixed central portion 11, stage 12 and individual.

U-like metal members $12a_1$-$12c_3$ are all rigid. Here, the above-mentioned bimorph cells 13 are described in brief with reference to FIG. 4.

FIG. 4 is a perspective view of one of the bimorph cells $12a_1$-$12c_3$. In the figure, there are shown piezoelectric elements 13a,13b and a common electrode 13c provided between the piezoelectric elements 13a,13b. The piezoelectric elements 13a,13b are rigidly cemented together with the common electrode 13c interposed therebetween. Designated at numerals 13d,13e are surface electrodes applied fixedly to the piezoelectric elements 13a,13b respectively. In the above stacked, laminated or double-layered structure, when a voltage of such a polarity that the piezoelectric element 13a is caused to contract is applied between the surface electrode 13d and common electrode 13c and at the same time, another voltage of such a polarity that the piezoelectric element 13b is caused to expand is applied, the piezoelectric elements 13a,13b are respectively caused to contract and expand in the directions shown by arrows. As a result, the bimorph cell 13 is deformed as a whole as shown in the figure. Owing to this property, the bimorph cell 13 can provide a greater degree of displacement compared with a single piezoelectric element.

In the device shown in FIG. 3, the bimorph cells 13 which have the above-described property are fixed at one ends thereof in their corresponding vertical slots 11a,11b,11c but the other ends of the bimorph cells 13 remain as free ends and are kept via their respective beads 13A in contact with the corresponding U-like metal members $12a_1$-$12c_3$. Let's now assume that suitable voltages are applied respectively to the bimorph cells 13 so as to cause them to undergo such deformations as shown in FIG. 4. Corresponding to the deformations of the bimorph cells 13, the stage 12 undergoes an angular displacement about the fixed central portion 11. If a fine motion table is fixedly mounted on the stage 12, it is possible to have the fine motion table to undergo the angular displacement.

In the above-described conventional device, the U-like metal members $12a_1$-$12c_3$ and their corresponding bimorph cells 13 are kept in mutual contact. Owing to this structural feature, the bimorph cells are mounted while being allowed to undergo free deformations. This structural feature can thus avoid the imminent restraint (interference) of displacements which takes place if the bimorph cells 13 should be fixed to the stage 12. However, the structure of this conventional device is complex. Moreover, it requires to determine the positions of attachment of the U-like metal elements $12a_1$-$12c_3$ in precise registration with the positions of the tips of the corresponding bimorph cells 13. The conventional device thus requires an extremely great deal of man power and time for its manufacture. Furthermore, the contact between each of the bimorph cells 13 and its corresponding U-like metal member must not be light. When the bimorph cells 13 are deformed, they hence develop large sliding resistance with their corresponding U-like metal members. Accordingly, a large degree of interference still remains.

The conventional fine positioning devices shown respectively in FIGS. 1, 2 and 3 are all accompanied by their own problems as mentioned above. They are also accompanied by a further serious problem. Namely, the fine positioning devices depicted in FIGS. 1 and 2 may be used only for one-dimensional and two-dimensional positioning respectively. They can produce neither displacement along the z-axis nor angular displacement about the x-, y- or z-axis. Turning to the fine positioning device shown in FIG. 3, it can produce neither displacement along the x-, y- or z-axis nor angular displacement about any one of the other two axes. From these conventional fine positioning devices, it may only be feasible to contemplate a 3-axis fine positioning device, which can produce displacements along both x-axis and y-axis and an angular displacement about the z-axis, by combining the device of FIG. 2 and that of FIG. 3 together. It is believed to be extremely difficult to construct a 4-axis or larger multi-axis fine positioning device on the basis of such conventional devices. Even if these conventional devices are combined together in any way, the above-described problem of interference is believed to become unavoidable, in particular as the number of axes increases.

With the foregoing in view, the present invention has as its object the solution of the problems of the above-described prior art and at the same time the provision of a fine positioning device which can avoid the occurrence of interfered displacements, has an extremely high degree of accuracy and facilitates its fabrication as a larger multi-axis fine positioning device.

In order to achieve the above object, the present invention provides a fine positioning device which is composed of at least one of the following parallel and radial flexible-beam displacement mechanisms:

a parallel flexible-beam displacement mechanism composed of a first rigid portion rigid against forces at least in one specific direction, a second rigid portion opposing to the first rigid portion and being rigid against forces at least in the same specific direction as above, plural flexible beams connecting the first rigid portion and the opposing second rigid portion to each other and arranged in parallel to each other or one another, and a first actuator mounted within the region surrounded by the first rigid portion, the second rigid portion and desired two of the plural flexible beams and adapted to have the plural flexible beams undergo bending deformation; and a radial flexible-beam displacement mechanism composed of a third rigid portion rigid against torques at least around one specific axis, a fourth rigid portion opposing to the third rigid portion and being rigid against torques at least around the same axis as above, plural flexible beams connecting the third rigid portion and the opposing fourth rigid portion to each other and arrange radially relative to a specific axis, and a second actuator mounted within the region surrounded by the third rigid portion, the fourth rigid portion and desired two of the plural flexible beams and adapted to have the plural flexible beams undergo bending deformation.

As described above, the fine positioning device of this invention is constructed of at least one of parallel flexible-beam displacement mechanisms and radial flexible-beam displacement mechanisms. It can thus obtain fine linear displacements and/or fine angular displacements with good accuracy. The present invention also facilitates the construction of a multi-axis positioning device.

The above and other objects, features and advantages of this invention will become apparent from the following description and the appended claims, taken in conjunction with the accompanying drawings, in which:

Figure 9:
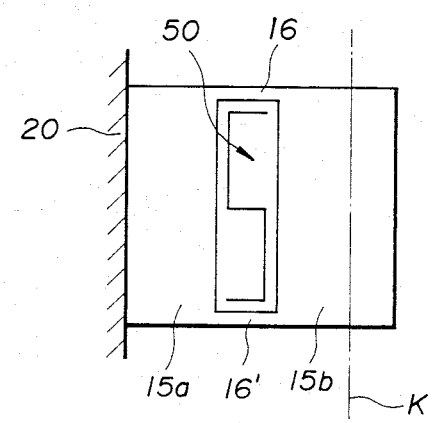
Figure 9:
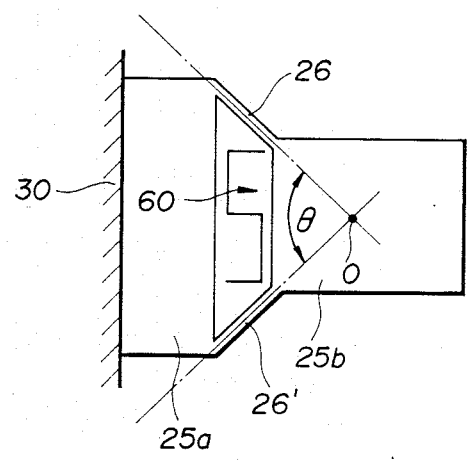
Figure 10:
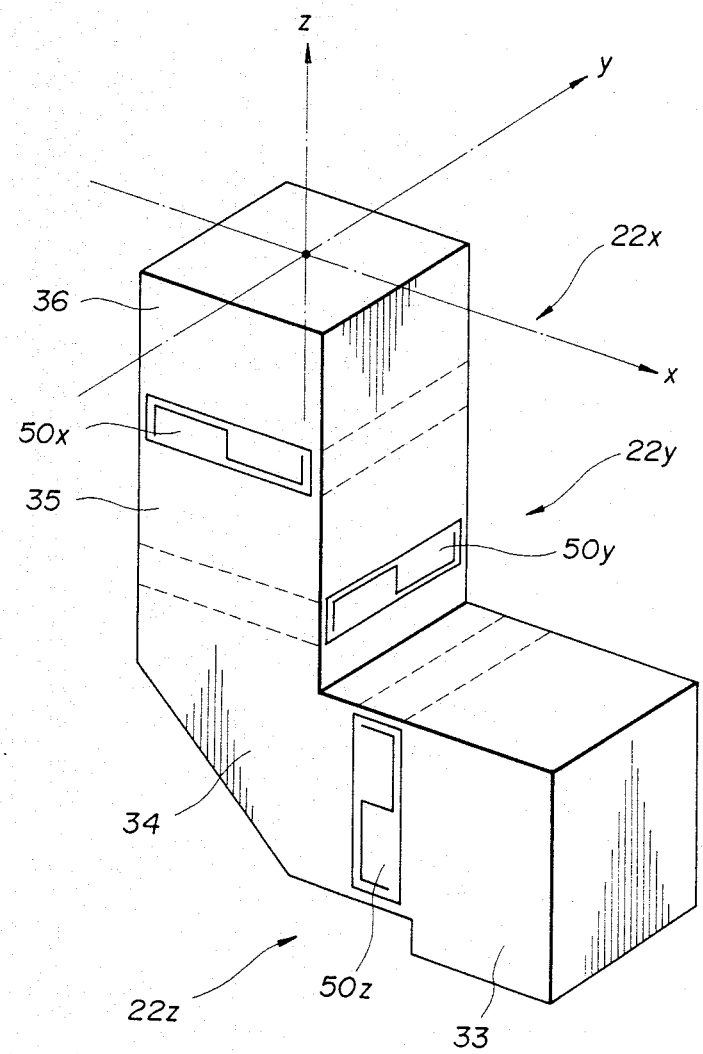
Figure 11:
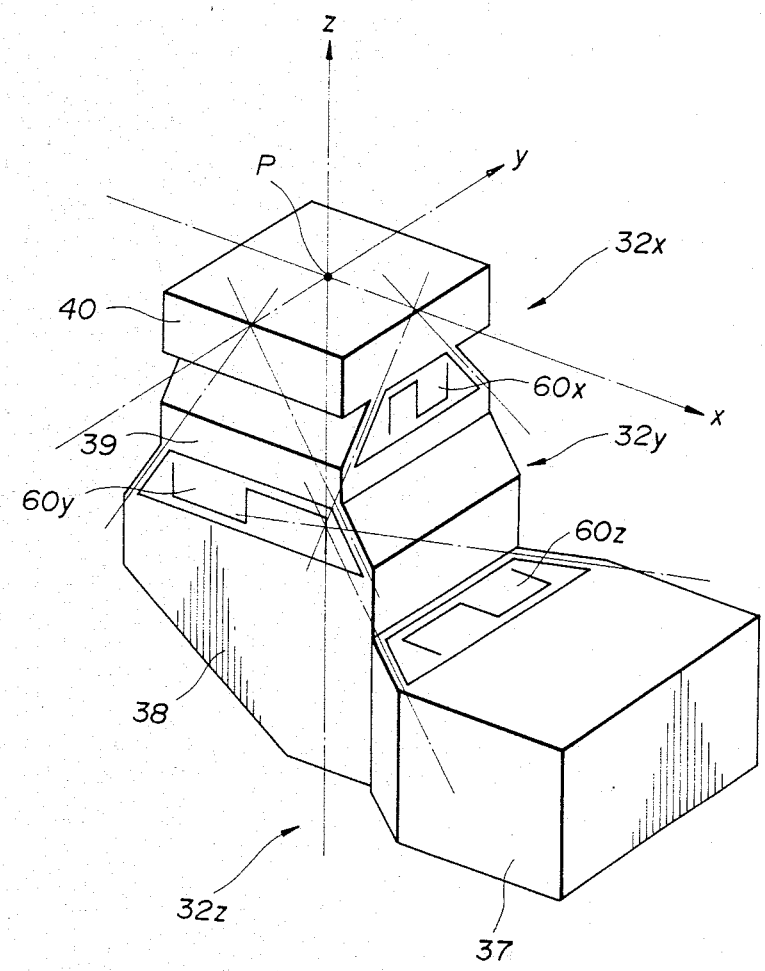
Figure 12:
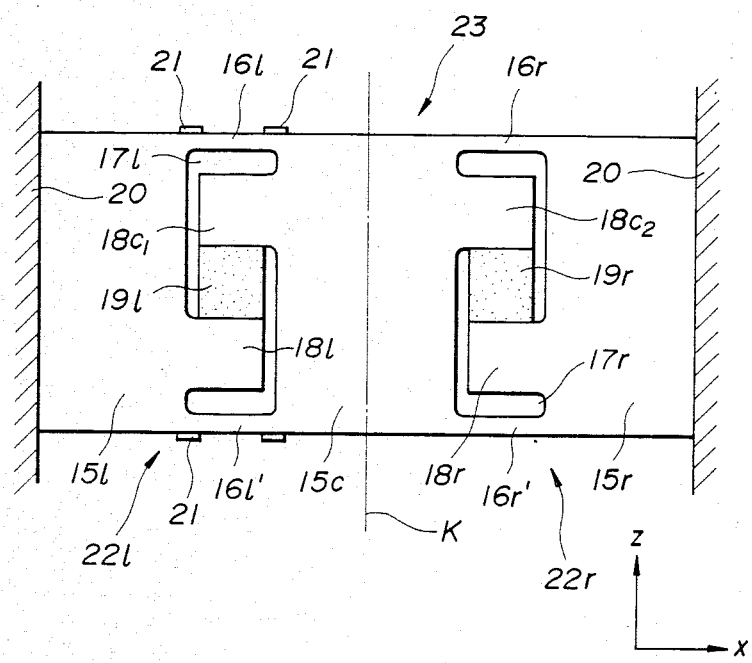
Figure 13:
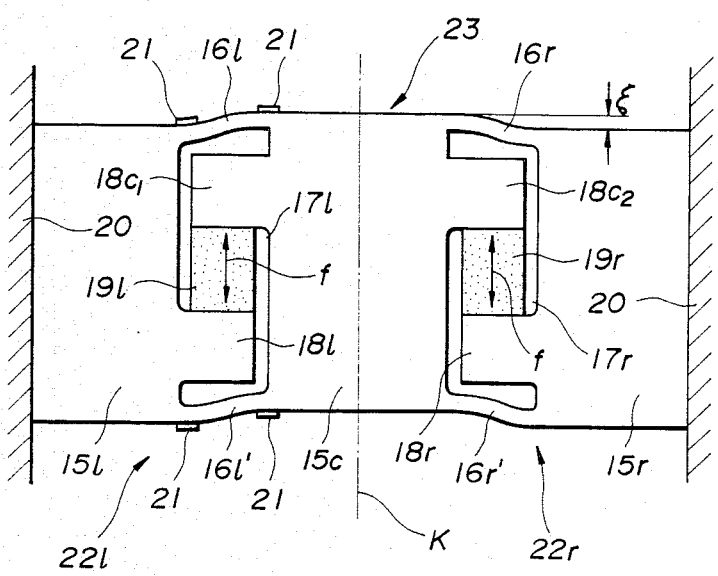
Figure 14:
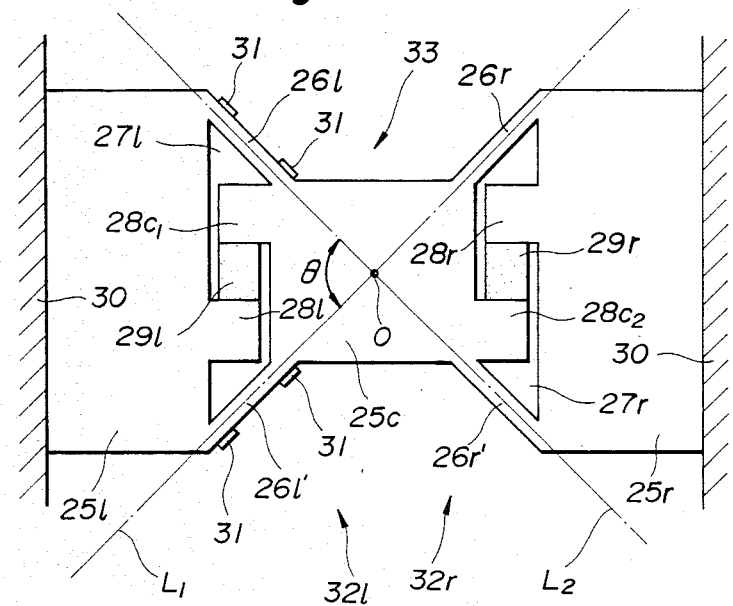
Figure 15:
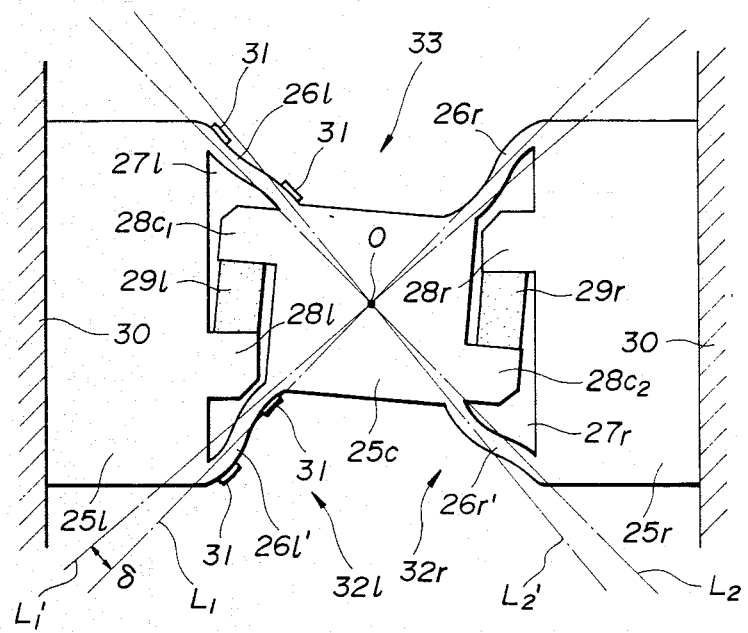
Figure 16:
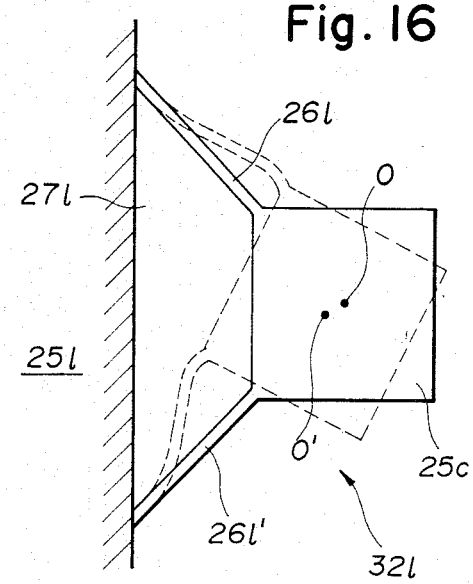
Figure 17:
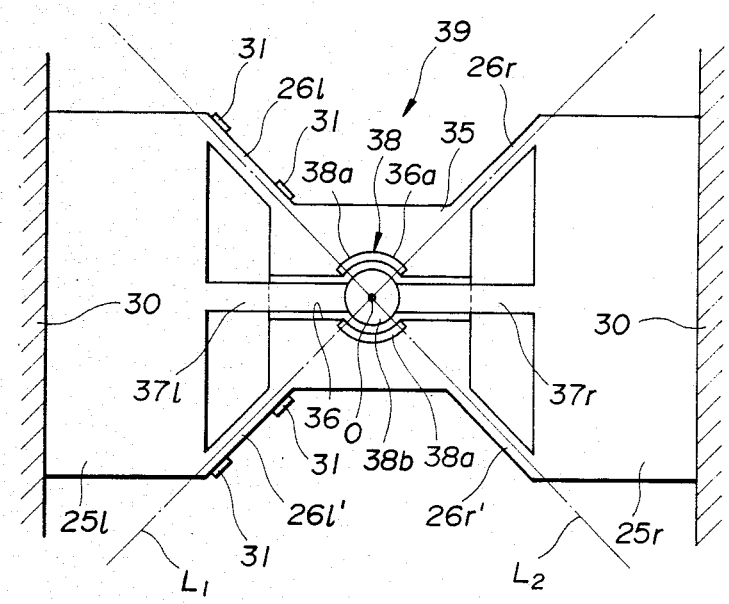
Figure 18:
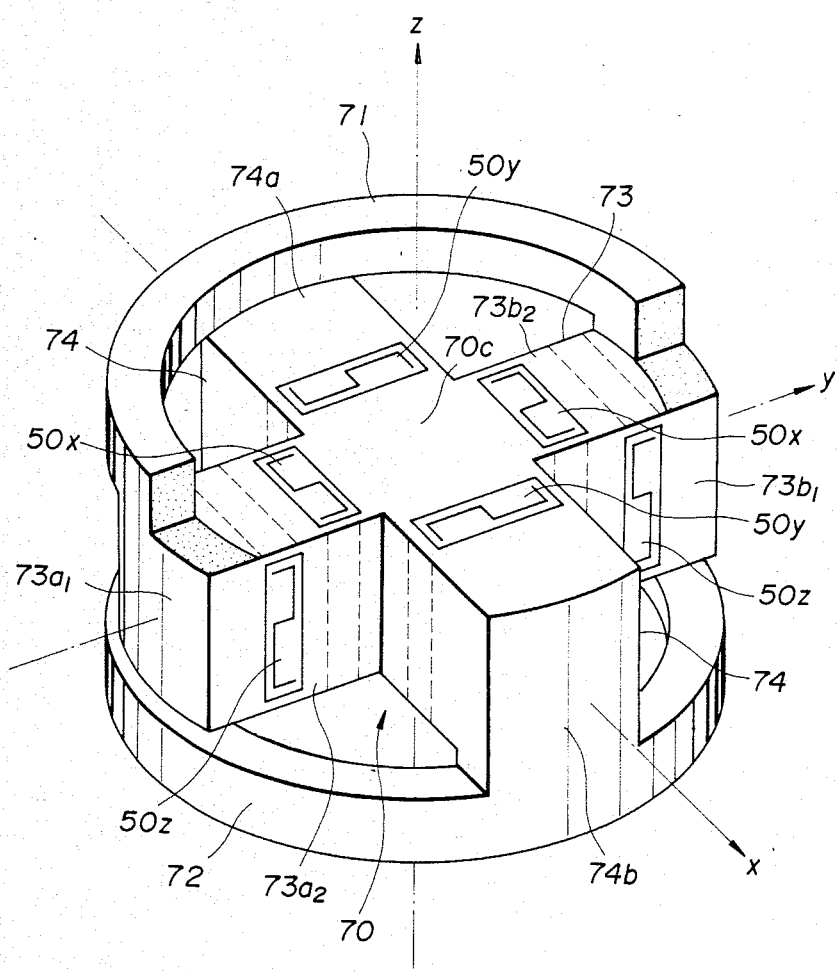
Figure 19:
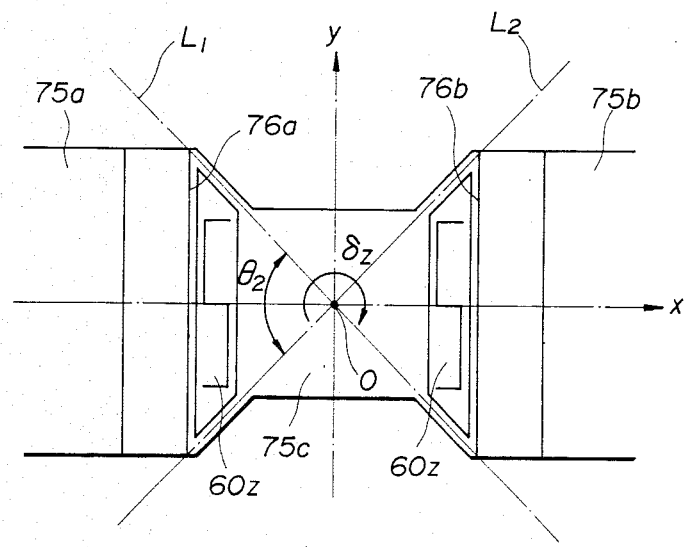
Figure 19:
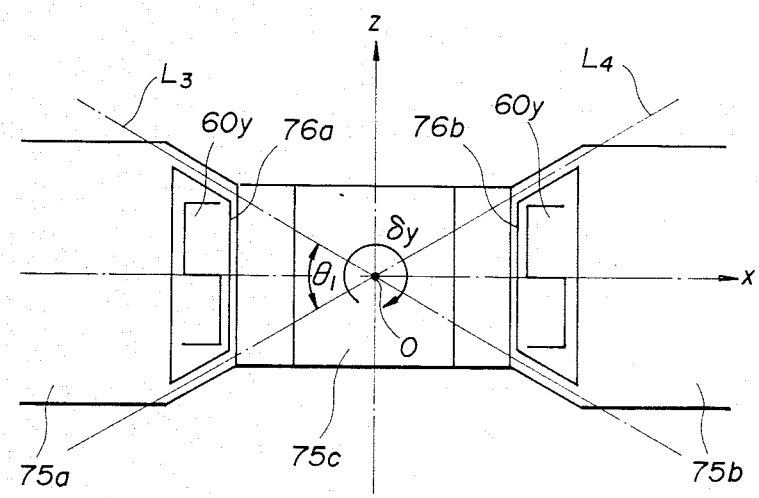
Figure 20:
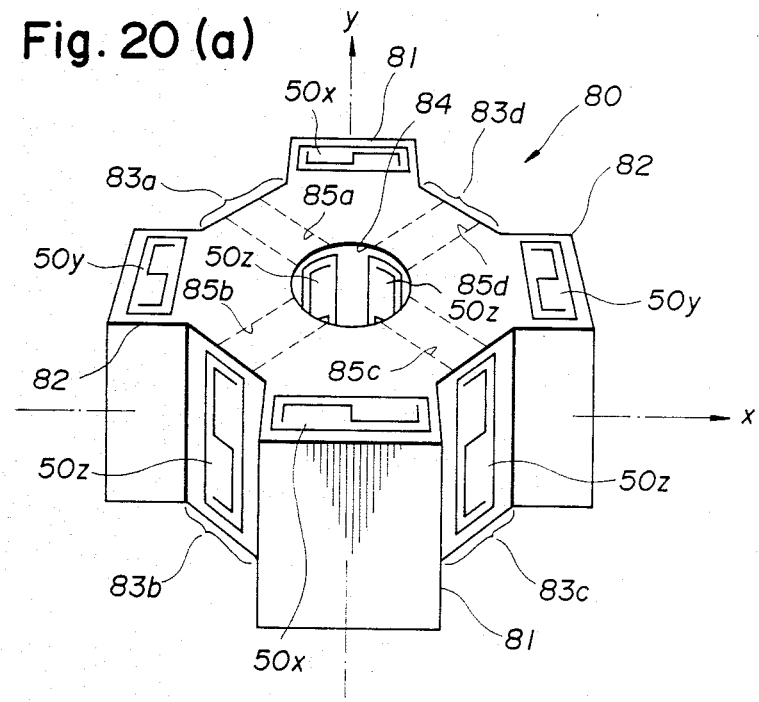
Figure 20:
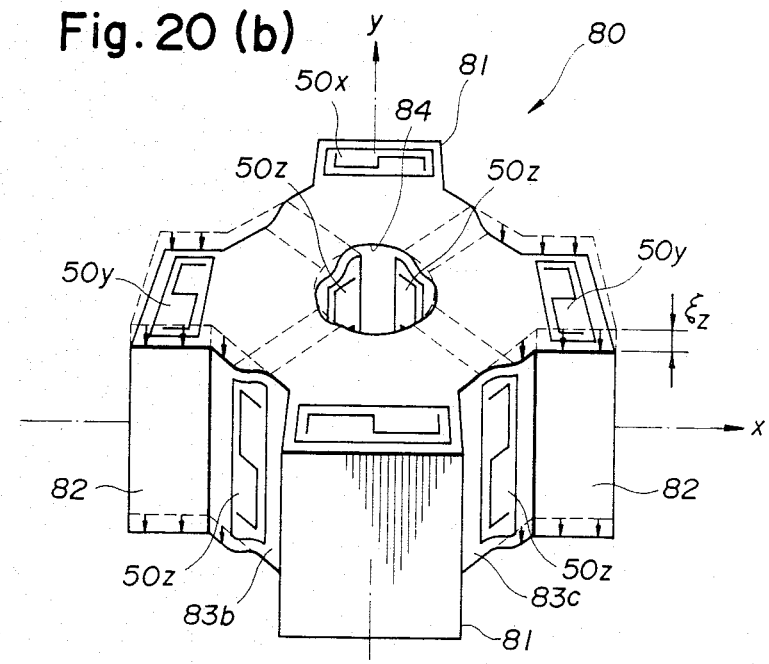

FIGS. 9(a) and 9(b) are schematic illustrations for describing reference numerals employed for a linear drive unit and an angular drive unit;

FIG. 10 is a perspective view of a fine positioning device according to the third embodiment of this invention;

FIG. 11 is a perspective view of a fine positioning device according to the fourth embodiment of this invention;

FIGS. 12 and 13 are side views of a fine positioning device according to the sixth embodiment of this invention;

FIGS. 14 and 15 are side views of a fine positioning device according to the seventh embodiment of this invention;

FIG. 16 is a schematic illustration for describing the operation of the device depicted in FIG. 14;

FIG. 17 is a side view of a fine positioning device according to the eighth embodiment of this invention;

FIG. 18 is a perspective view of a fine positioning device according to the ninth embodiment of this invention;

FIGS. 19(a) and 19(b) are plan and side views of a fine positioning device according to the tenth embodiment of this invention;

FIGS. 20(a) and 20(b) are perspective views of a fine positioning device according to the eleventh embodiment of this invention;

FIGS. 21, 22, 23, 24 and 25 are partly cutaway perspective view, partly cross-sectional plan view, partly cross-sectional side views and simplified side view of a fine positioning device according to the twelfth embodiment of this invention.

The present invention will hereinafter be described on the basis of the some preferred embodiments shown by way of example in the accompanying drawings.

Figure 5:
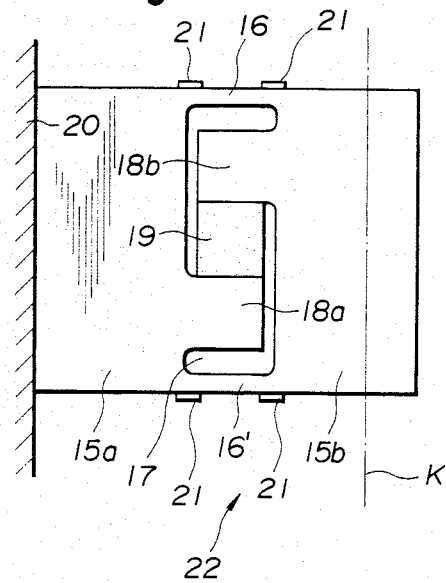
FIGS. 5 and 6 are side views of a fine positioning device according to the first embodiment of this invention.

FIG. 5 is a side view of a fine positioning device according to the first embodiment of this invention. In the figure, numerals 15a,15b indicate rigid portions which are located right and left in the drawing. Designated at numerals 16,16' are parallel flexible beams which are planar, are formed between the the rigid portions 15a,15b and integrally therewith and are parallel to each other. Numeral 17 indicates a through-hole bored for the integral formation of the parallel flexible beams 16,16' and the rigid portions 15a,15b. Numeral 18a designates a tongue extending from the rigid portion 15a into the through-hole 17 while numeral 18b indicates another tongue extending out from the rigid portion 15b into the through-hole 17. These tongues 18a,18b are aligned with an interval therebetween in the vertical direction as seen in the figure. Owing to the provision of the tongues 18a,18b, the through-hole 17 takes a square S-like form. Designated at numeral 19 is a piezoelectric actuator, which is fixedly interposed between the tongues 18a, 18b. The piezoelectric actuator 19 is constructed by stacking a plurality of piezoelectric elements one over another. The piezoelectric actuator 19 produces forces in a direction perpendicular to the corresponding surfaces of the parallel flexible beams 16,16' so that the parallel flexible beams 16,16' are caused to undergo bending deformations. The magnitude of each force which is produced in the piezoelectric actuator 19 may be adjusted by controlling the voltage to be applied to the piezoelectric actuator 19 by an unillustrated device. Numeral 20 indicates a further rigid structure which supports the rigid portion 15a. Designated at numeral 21 are strain gauges adapted to detect strains which are to be developed in the parallel flexible beams 16,16'. The strain gauges 21 are provided at the points of connection between the parallel flexible beams 16,16' and rigid portions 15a, 15b.

A parallel flexible-beam displacement mechanism 22 is constructed by the rigid portions 15a,15b, parallel flexible beams 16,16', tongues 18a,18b and piezoelectric actuator 19.

As the standard axis for the parallel flexible-beam displacement mechanism 22, there is given a line K which passes through a central part of the rigid portion 15b, extends at a right angle relative to planes in which the parallel flexible beams 16,16' lie respectively, and passes through the depthwise central axis of the parallel flexible-beam displacement mechanism 22 as viewed in FIG. 5. This standard axis K indicates the position of the parallel flexible-beam displacement mechanism 22 and the direction of its installation.

Figure 6:
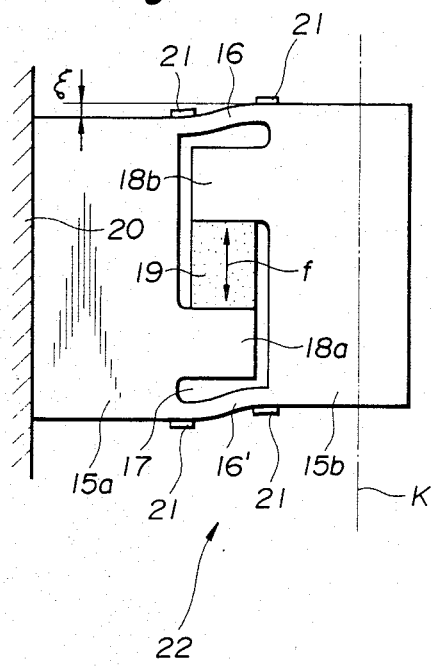

The operation of this embodiment will next be described with reference to FIG. 6, which is a side view of the parallel flexible-beam displacement mechanism 22 depicted in FIG. 5 after it has been deformed. Here, coordinate axes are established as shown in the figure (the y-axis extends in the direction perpendicular to the drawing sheet). When a voltage is applied to the piezoelectric actuator 19, the piezoelectric actuator 19 produces, along the z-axis, forces f the magnitudes of which are proportional to the voltage. By the forces f, the rigid portion 15b is pushed upwardly along the z-axis. The parallel flexible beams 16,16' thus undergo bending deformations in the same manner as the parallel springs 2a,2b shown in FIG. 1, whereby the rigid portion 15b is displaced upwardly along the z-axis.

When the parallel flexible beams 16,16' are caused to expand and are thus bent as mentioned above, each of the strain gauges 21 undergoes either compressive or expansive strain depending on its position. Since the degree of displacement of the rigid portion 15b can be determined by detecting the strain with the strain gauges 21, the main displacement can be determined provided that the voltage to be applied to the piezoelectric actuator 19 is controlled on the basis of the detected data, in other words, a so-called feed back control system is constructed. The control of the voltage to be applied to the piezoelectric actuator 19 may be effected by forming the strain gauges 21 into a suitable electric circuit such as a bridge circuit to obtain the thus-detected strain as an electric signal (the displacement $\epsilon$ is proportional exactly with the strain), comparing the electric signal with a signal, which corresponds to a target displacement, at a comparator to calculate a signal corresponding to the difference between both signals, and controlling the voltage so as to reduce the difference-representing signal to zero (0). Feed back control systems each of which compares each detected value with the target value to control their difference to zero (0) in the above manner have been well known. Since one of such known feed back control systems is applied, as is, in the present embodiment, strain gauges 21 which are employed as detecting means in such a feed back control system are singly referred to in the description of the present embodiment. Illustration of the other elements of the feed back control system and their detailed description are omitted.

When the voltage applied to the piezoelectric actuator 19 is eliminated, both parallel flexible beams 16,16' regain their original state prior to their deformations. The parallel flexible-beam displacement mechanism 22 thus returns to its state shown in FIG. 5, whereby the displacement $\epsilon$ is reduced to zero (0).

Since the piezoelectric actuator adapted to produce forces is received in the region defined by the rigid portions and parallel flexible beams of the parallel flexible-beam displacement mechanism in the present embodiment, no externally-extending portions are required and the parallel flexible-beam displacement mechanism can be constructed into a simple shape. Owing to this structural feature, it is possible to allow forces, which have been produced by the piezoelectric actuator, to be transmitted very close to the respective parallel flexible beams. Even when such mechanisms are stacked, the above-described structure can hence solve the above-mentioned problem that actuators interfere one another. Accordingly, parallel flexible-beam displacement mechanisms can be stacked with ease to produce displacements along many axes. When stacked to produce displacements along many axes, it is possible to accurately detect, by strain gauges, displacements of the parallel flexible beams of the resulting multi-axis positioning mechanism based on the strains of the parallel flexible beams, which do not interfere one another, and then to control the force to be produced by the piezoelectric actuator on the basis of the thus-detected value.

Figure 7:
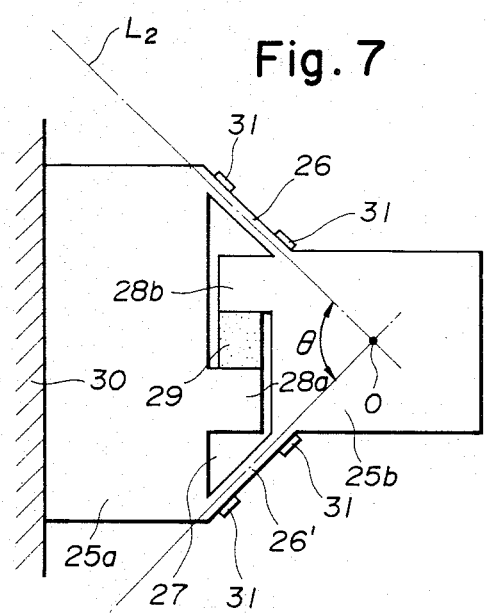
FIGS. 7 and 8 are side views of a fine positioning device according to the second embodiment of this invention.

FIG. 7 is a side view of a fine positioning device according to the second embodiment of this invention. In the figure, numerals 25a,25b indicate rigid portions which are located right and left there. Designated at numerals 26,26' are planar radial flexible beams provided between and formed integrally with the rigid portions 25a,25b and are arranged radially from a common point 0. Numeral 27 indicates a through-hole bored to form the radial flexible beams 26,26' and the rigid portions 25a,25b integrally. Numeral 28a indicates a tongue extending from the rigid portion 25a into the through-hole 27 while numeral 28b designates another tongue extending from the rigid portion 25b into the through hole 27. These tongues 28a,28b are mutually registered with an interval in the vertical direction in the figure. Owing to the provision of these tongues 28a,28b, the through-hole 27 takes substantially a square S-like shape. Designated at numeral 29 is a piezoelectric actuator fixed between the tongues 28a,28b. When a circle passing through the piezoelectric actuator 29 is drawn about the point 0, the piezoelectric actuator 29 produces a force f in a direction tangent to the circle (equivalent to a torque with respect to the point 0). The magnitude of the above force is controlled by the voltage applied to the piezoelectric actuator 29. Numeral 30 indicates a rigid structure which supports the rigid portion 25a. Designated at numeral 31 are strain gauges adapted to detect strains of the radial flexible beams 26,26'. The strain gauges 31 are provided at points of connection between the radial flexible beams 26,26' and rigid portions 25a,25b.

A radial flexible-beam displacement mechanism 32 is composed of the rigid portions 25a,25b, radial flexible beams 26,26', tongues 28a,28b and piezoelectric actuator 29. A line which extends through the point 0 in the direction perpendicular to the drawing sheet is used as a standard axis which indicates the position and direction of installation of the radial flexible-beam displacement mechanism 32.

Figure 8:
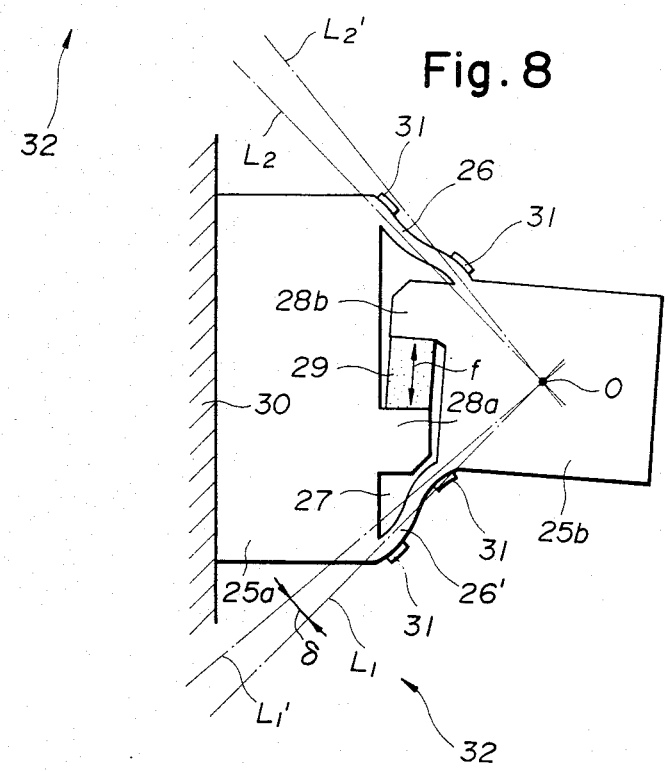

The operation of this embodiment will next be described with reference to FIG. 8, which is a side view of the radial flexible-beam displacement mechanism 32 shown in FIG. 7 after it has been deformed. Now, a voltage has been applied to the piezoelectric actuator 29 so that the force f is produced in the aforementioned tangential direction. The tongue 28b is thus pushed upwardly along the tangent by the force produced in the piezoelectric actuator 29. Since the rigid portion 25b is connected to the rigid portion 25a by way of the radial flexible beams 26,26', the radial flexible-beam displacement mechanism 32, as a result of application of the above force, undergoes a minute displacement so that the points of connection between the radial flexible beams 26,26' and the rigid portion 25a are located respectively on straight lines $L_1,L_2$, which extend radially from the point 0, but the points of connection between the radial flexible beams 26,26' and the rigid portion 25b fall on straight lines $L_1',L_2'$ (these lines also extend radially from the point 0) which are slightly offset from the straight lines $L_1,L_2$. The rigid portion 25b is accordingly turned clockwise, as viewed in the figure, over a small angle $\delta$. The degree of this angular displacement $\delta$ is determined by the rigidity of the radial flexible beams 26,26' against bending forces. If the force f is controlled accurately, the angular displacement $\delta$ can also be controlled with the same degree of accuracy. As apparent from the figure, the structure of this embodiment is far simpler compared with the conventional device shown in FIG. 3. Especially, the mounting of the piezoelectric actuator does not require any cumbersome procedure, e.g., positioning such as that required upon mounting the bimorph cell in the conventional device. In this invention, a displacement mechanism which is equipped, pertaining also to angular displacements, with various features such as those attained in the first embodiment has been materialized as described above.

The control of the angular displacement $\delta$ by the feed back control system making use of the strain gauges 31 can be effected in the same manner as in the preceding embodiment. By providing the strain gauges 31 at the points of connection between the radial flexible beams 26,26' and the rigid portions 25a,25b, it is the same as the above embodiment that when a plurality of radial flexible-beam displacement mechanisms are combined to produce radial displacements about plural axes, correct detection of strains can also be achieved without interference from one another in the present embodiment.

When the voltage applied to the piezoelectric actuator 29 is eliminated, both radial flexible beams 26,26' return to their original state prior to their deformations, the radial flexible-beam displacement mechanism 32 returns to its state shown in FIG. 7, and the angular displacement δ is reduced to zero (0).

Since the piezoelectric actuator adapted to produce forces is received in the region defined by the rigid portions and radial flexible beams of the radial flexible-beam displacement mechanism in the present embodiment, no externally-extending portions are required and the radial flexible-beam displacement mechanism can be constructed into a simple shape. Owing to this structural feature, it is possible to allow forces, which have been produced by the piezoelectric actuator, to be transmitted very close to the respective radial flexible beams. Even when such mechanisms are stacked, the above-described structure can hence solve the above-mentioned problem that actuators interfere one another. Accordingly, radial flexible-beam displacement mechanisms can be stacked with ease to produce angular displacements about many axes. When stacked to produce angular displacements about many axes, it is possible to accurately detect, with strain gauges, displacements of the radial flexible beams of the resulting multi-axis positioning mechanism based on the strains of the radial flexible beams, which do not interfere one another, and then to control the force to be produced by the piezoelectric actuator on the basis of the thus-detected value.

The function of the parallel flexible-beam displacement mechanism and that of the radial flexible-beam displacement mechanism have been described above in detail. They can respectively produce displacements along one of the three coordinate axes (x,y,z) and angular displacements about one of the three coordinate axes. If a plurality of parallel flexible-beam displacement mechanisms are combined together with their standard axes neither coincided nor arranged in parallel, it is possible to effect fine positioning along two or three coordinate axes by a single piece of device. If a plurality of radial flexible-beam displacement mechanisms are combined with their standard axes neither coincided nor arranged in parallel, it is possible to effect, by a single piece of device, fine positioning with respect to angular displacements about two or three coordinate axes. If one or more parallel flexible-beam displacement mechanisms and one or more radial flexible-beam displacement mechanisms are suitably combined together, it is apparently possible to conduct, by a single piece of device, fine positioning with respect to displacement(s) and angular displacement(s) along and about one to three coordinate axes.

Figure 1:
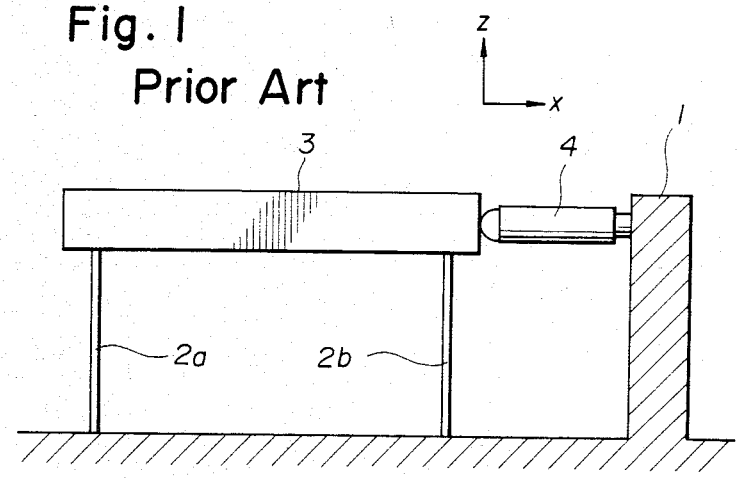
FIGS. 1, 2 and 3 are side view, perspective view and partly cut-away perspective view of conventional fine positioning devices.
Figure 2:
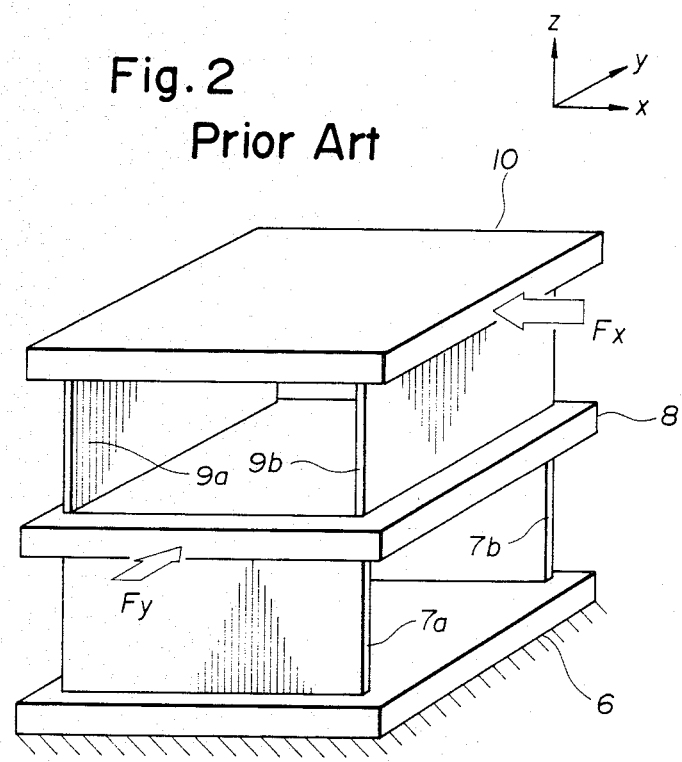
Figure 3:
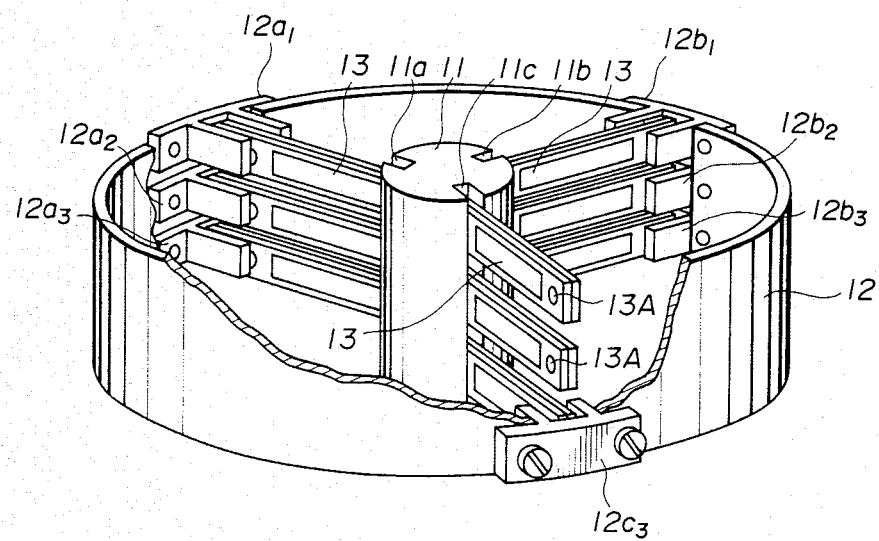
Figure 4:
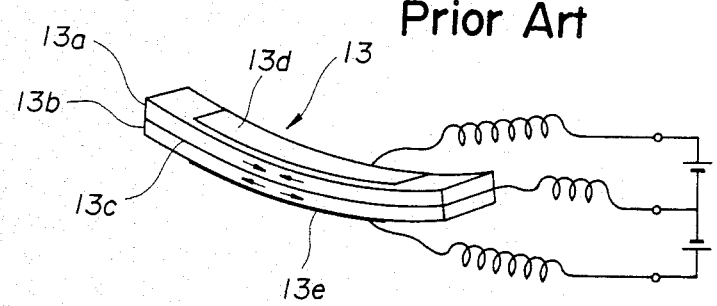
FIG. 4 is a perspective view of one of the bimorph cells employed in the device depicted in FIG. 3.

When such combinations are taken into consideration, conventional devices are unable to obtain displacements with respect to more than two coordinate axes in the case of a single piece of device such as that depicted in FIG. 2 or more than three coordinate axes even if the devices depicted in FIGS. 2 and 3 are combined together. It is difficult to effect any further combination. Even if such a complex combination should be conceivable, the resulting device will inevitably have an unduly complex structure which will render the device unsuitable for actual applications. On the other hand, there has not been proposed any device which has such a simple structure as comparable with the structure depicted in FIG. 1 and can be used to obtain angular displacements. Unlike such conventional devices, the above-mentioned combination can be easily achieved if one or more of parallel flexible-beam displacement mechanisms, which pertain to the present embodiment, are combined with one or more radial flexible-beam displacement mechanisms which also relate to the present embodiment. Moreover, the thus-combined device can include another great advantage that no interference is developed with respect to the displacements and angular displacements of the parallel flexible-beam displacement mechanisms and radial flexible-beam displacement mechanisms for the respective axes.

One embodiment of the above-described combined structure will hereinafter be described. It seems to be simpler and easier for understanding if the parallel flexible beams, radial flexible beams, tongues extending out from the respective rigid portions and piezoelectric actuators fixed between their associated tongues, all of which are depicted in FIGS. 5 through 7, are taken as a single drive unit. In the subsequent embodiments, the above-mentioned drive unit of each parallel flexible-beam displacement mechanism will be called a "linear drive unit 50". The letter of the coordinate axis corresponding to the direction of each displacement by the linear drive unit 50 is also attached to the reference numeral "50". On the other hand, the above-mentioned drive unit of each radial flexible-beam displacement mechanism will be called an "angular drive unit 60". The letter of the coordinate axis corresponding to the axis of each angular displacement by the angular drive unit 60 is also attached to the reference numeral "60". Furthermore, the sketch of each linear drive unit 50 and angular drive unit 60 will be simplified for the same reasons as mentioned above. As shown in FIGS. 9(a) and 9(b), they will each be shown substantially in the form of square S or inverted square S. Here, this square S or inverted square S is supposed to conform with the direction of extension of the tongue of its associated rigid portion. The above-mentioned embodiment of such a combined structure will next be described.

FIG. 10 is a perspective view of a fine positioning device pertaining to the third embodiment of this invention. The device of this embodiment can produce displacements along three axes (x,y,z) when the coordinate axes are given at shown in the figure. The device has such a structure that three parallel flexible-beam displacement mechanisms, each of the same type as the parallel flexible-beam displacement mechanism 22 of the first embodiment, are combined together with their standard axes Ks extending at a right angle to one another and their adjacent rigid portions being in an integrated form. In the figure, there are illustrated rigid portions 33,34,35,36, a linear drive unit 50z interposed between the rigid portions 33,34, another linear drive unit 50y interposed between the rigid portions 34,35, and a further linear drive unit 50x interposed between the rigid portions 35,36. By the rigid portions 33,34 and linear drive unit 50z, a parallel flexible-beam displacement mechanism 22z is constructed for the z-axis. On the other hand, another parallel flexible-beam displacement mechanism 22y for the y-axis is constructed by the rigid portions 34,35 and linear drive unit 50y. In addition, a further parallel flexible-beam displacement mechanism 22x for the x-axis is constructed by the rigid portions 35,36 and linear drive unit 50x.

Let's now suppose by way of example that the rigid portion 33 is fixed and the piezoelectric actuator of the linear drive unit 50z is driven in this state. As understood from the above explanation, the rigid portion 34 undergoes a displacement along the z-axis and the rigid portion 36 thus undergoes a similar displacement. Similarly, the rigid portion 36 undergoes a displacement along the y-axis when the linear drive unit 50y is driven, and the rigid portion 36 undergoes a displacment along the x-axis when the linear drive unit 50x is driven. Since these displacements are allowed to occur independently from one another, displacements can be freely produced along the three axes by driving the individual linear drive units 50x,50y,50z suitably.

As described above, the three parallel flexible-beam displacement mechanisms are combined and integrated with their standard axes extending at a right angle to one another in the present embodiment. It is thus possible to reduce the size of each displacement mechanism and to prevent the piezoelectric actuator of one of the drive systems from interfering the other drive systems. Furthermore, the parallel flexible beams in one of the three linear drive units is not affected at all by the other linear drive units although the three linear drive units are stacked. By detecting strains of the parallel flexible beams in the three linear drive units, it is thus possible to detect displacements produced respectively along the axes. By using such detection data for feed back control, positioning can be performed with still higher accuracy.

FIG. 11 is a perspective view of a fine positioning device according to the fourth embodiment of this invention. The device of this invention can produce angular displacements about three axes (x,y,z) when the coordinate axes are given as illustrated in the figure. The device of this embodiment has such a structure that three radial flexible-beam displacement mechanisms, each of the same type as the radial flexible-beam displacement mechanism 32 of the second embodiment, are combined together with their standard axes Ks extending at a right angle to one another and their adjacent rigid portions being integrated. A crossing point P of the three axes x,y,z is located on the surface of the rigid portion 40. In the figure, there are illustrated rigid portions 37,38,39,40, an angular drive unit 60z interposed between the rigid portions 37,38, another angular drive unit 60y interposed between the rigid portions 38,39, and a further angular drive unit 60x interposed between the rigid portions 39,40. A radial flexible-beam displacement mechanism 32z is formed for the z-axis by the rigid portions 37,38 and angular drive unit 60z, another radial flexible-beam displacement mechanism 32y is formed for the y-axis by the rigid portions 38,39 and angular drive unit 60y, and a further radial flexible-beam displacement mechanism 32x is formed for the x-axis by the rigid portions 39,40 and angular drive unit 60x.

Let's now assume by way of example that the rigid portion 37 is fixed and the piezoelectric actuator of the angular drive unit 60z is driven. As understood from the preceding explanation, the rigid portion 38 produces an angular displacement around the z-axis. Thus, the rigid portion 40 also produces an angular displacement about the z-axis. Similarly, the rigid portion 40 produces an angular displacement about the y-axis when the angular drive unit 60y is driven, and the rigid portion 40 produces an angular displacement about the x-axis when the angular drive unit 60x is driven. Since these angular displacements are produced independently from one another, it is possible to freely produce angular displacements about the three axes by driving the individual angular drive units 60x,60y,60z suitably.

As described above, the three radial flexible-beam displacement mechanisms are combined and integrated with their standard axes extending at a right angle to one another in the present embodiment. It is thus possible to reduce the size of each displacement mechanism and to prevent the piezoelectric actuator of one of the drive systems from interfering the other drive systems. Furthermore, the radial flexible beams in one of the three angular drive units is not affected at all by the other angular drive units although the three angular drive units are stacked. By detecting strains of the radial flexible beams in the three linear drive units, it is thus possible to detect angular displacements produced respectively about the axes. By using such detection data for feed back control, positioning can be performed with still higher accuracy.

Furthermore, the three axes x,y,z extend at a right angle to one another and moreover, they all pass through the point P on the surface of the rigid portion 40. This structural feature has brought about another advantageous effect which will hereinafter be described. Let's now deem the rigid portion 40 as a fine motion table. When the individual radial flexible-beam displacement mechanisms 32x,32y,32z are actuated, there is an advantageous effect that the resulting angular displacements serve as angular displacements about the point P. This advantageous effect can be understood better if one takes into consideration a situation under which none of the axes x,y,z satisfy the above-mentioned conditions with respect to the point P. Let's now assume that the standard axis K of the radial flexible-beam displacement mechanism 32x for the x-axis is offset from the point P toward the z-axis. When an angular displacement is produced about the x-axis, it is clear that the point P undergoes translational displacements along both y-axis and z-axis. These translational displacements develop undesirable effects in positioning. The existence of the point P on the surface of the rigid portion 40 thus has such a great advantage that the above-mentioned undesirable effects can be avoided, although these translational displacements are of such nature that since the dimensions of every part has been known, they can be precisely determined in advance by calculation. It is thus not absolutely necessary to position the point P on the surface of the rigid portion 40. If the point P is positioned at a location other than the surface of the rigid portion 40, it is however impossible to avoid such a serious disadvantage that the above-mentioned translational displacements have to be compensated by certain means.

The fifth embodiment of this invention will next be described. This fifth embodiment is a 6-axis positioning device which can produce displacements along three axes x,y,z, which are mutually perpendicular, and angular displacements about the three axes x,y,z. This 6-axis positioning device can be obtained by merely connecting the device of the third embodiment with that of the fourth embodiment. Its figures are omitted since it is easily conceivable from the structures shown respectively in FIGS. 10 and 11.

The above-mentioned connection can be effected, for example, in the following manner. Namely, it is only necessary to integrate the rigid portion 36 depicted in FIG. 10 and the rigid portion 37 shown in FIG. 11 in such a positional relation that the standard axes Ks of the flexible-beam displacement mechanisms for each coordinate axis extend in parallel to each other. If the rigid portion 33 is fixed and the rigid portion 40 is employed as a fine motion table in the above-obtained structure, there is provided a fine positioning device which can produce 6 displacement components, namely, both translational and angular displacements with respect to all the three axes x,y,z.

It is apparent without need for any further explanation that the effects of this embodiment include, in combination, the effects of the third embodiment and those of the fourth embodiment. Turning back to the description on the effects of the fourth embodiment, it was mentioned that there is a need for the compensation of translational displacements by certain means where the point P is offset from the surface of the rigid portion 40. If such an offset is involved in the present embodiment, such compensatory means is nothing but the structure shown in FIG. 10. In order to achieve such compensation, it is necessary to conduct prescribed computation and then to actuate the structure of FIG. 10 in accordance with the results of the computation. This is extremely cumbersome and time-consuming. From this viewpoint, the excellent effects of a structure in which the point P is located on the surface of the rigid portion 40 are clear.

The first to fifth embodiments of this invention have been described above. Of these, the third to fifth embodiments require one aspect which must specifically be taken into consideration. Here, this aspect is dealt with.

The present invention has been completed on the basis of the characteristic property that a parallel flexible beam structure produces translational displacements only while a radial flexible beam structure produces angular displacements only. When more strict accuracy is sought for, this prerequisite may not be said to be absolutely true. When a calculation is made, for example, on a parallel flexible beam structure while hypothetically employing certain practical dimensions therefor, a parasitic displacement as small as about 1/100 of a displacement, which is intended to occur, may be developed in some instances. In usual applications, this figure may be considered to be within the tolerable error range. For this reason, the above aspect was ignored in the description of each of the above-mentioned embodiments. Where still higher accuracy is required, there is a need to avoid this error.

When a plurality of flexible-beam displacement mechanisms are stacked as in the third to fifth embodiments, the above-mentioned small error may be enlarged so much that it may no longer be ignorable. Even under such circumstances, substantially linear relations are established between the displacements produced by the respective flexible-beam displacement mechanisms and the corresponding actual displacements of the fine motion table, including displacements due to interferences so long as the displacements produced by the respective flexible-beam displacement mechanisms remain within a small displacement range. The influence of displacements caused by such interferences can thus be removed easily if the coefficients of such linear relations are determined and input data are in advance subjected to compensatory computation in accordance with the thus-determined coefficients. Furthermore, the thus-obtained positioning accuracy has been improved significantly compared with those available by the devices of the above-described embodiments without such compensatory computation.

Description will next be made on further embodiments which can solve the above-mentioned problem of parasitic displacements which may occur with the devices of the first to fifth embodiments.

FIG. 12 is a side view of a fine positioning device according to the sixth embodiment of this invention. As apparent from the figure, the present embodiment has such a structure that two parallel flexible-beam displacement mechanisms, each of the same type as the parallel flexible-beam displacement mechanism 22 of the first embodiment depicted in FIG. 5, are symmetrically combined together while sharing a rigid portion, which corresponds to the rigid portion $15b$. Thus, the elements of structure of the left-hand parallel flexible-beam displacement mechanism as viewed in the figure will be represented by adding letter l to the reference numerals for the corresponding elements of structure shown in FIG. 5, while the elements of structure of the right-hand parallel flexible-beam displacement mechanism will be represented by adding letter r to the reference numerals for the corresponding elements of structure shown in FIG. 5. Description on these common elements is omitted. Accordingly, description will be made on elements of structure, which are represented by different numerals. In the figure, there are shown a central rigid portion $15c$, a tongue $18c_1$ from the rigid portion $15c$ into a through-hole $17l$, and another tongue $18c_2$ extending from the rigid portion $15c$ into another through-hole $17r$. The tongues $18c_1, 18c_2$ are aligned, in a vertical direction as viewed in the figure, with further tongues $18l, 18r$ respectively with an interval therebetween. Piezoelectric actuators $19l, 19r$ are provided between the tongues $18c_1, 18l$ and between the tongues $18c_2, 18r$ respectively.

In the above structure, one of the parallel flexible-beam displacement mechanisms, i.e., the parallel flexible-beam displacement mechanism $22l$ is constructed by the rigid portions $15l, 15c$, parallel flexible beams $16l, 16l'$, tongues $18l, 18c_1$ piezoelectric actuator $19l$, while the other parallel flexible-beam displacement mechanism $22r$ is composed of the rigid portions $15r, 15c$, parallel flexible beams $16r, 16r'$, tongues $18r, 18c_2$ and piezoelectric actuator $19r$. Furthermore, the parallel flexible-beam displacement mechanism $22r$ and the parallel flexible-beam displacement mechanism $22l$ are in a relation of plane symmetry with respect to a plane extending at a right angle relative to a plane in which the parallel flexible beams $16l, 16l', 16r, 16r'$ lie. Letter K indicates a plane (standard plane), with respect to which both parallel flexible-beam displacement mechanisms $22l, 22r$ are symmetrical to each other. By the parallel flexible-beam displacement mechanisms $22l, 22r$ which are in a relation of plane symmetry, a symmetrical parallel flexible-beam displacement mechanism 23 is constructed.

A line, which lies in the standard plane K, is perpendicular to all the parallel flexible beams, and passes through the depthwise center of the symmetrical parallel flexible-beam displacement mechanism 23 as viewed in FIG. 12, is employed as a standard axis. This standard axis indicates the position and the direction of installation of the symmetrical parallel flexible-beam displacement mechanism 23.

The operation of this embodiment will next be described with reference to FIG. 13. FIG. 13 is a side view of the symmetrical parallel flexible-beam displacement mechanism 23 of FIG. 12 after it has been deformed. Here, coordinate axes are established as shown in the figure (the y-axis extends in a direction perpendicular to the drawing sheet). Let's now apply voltages to the piezoelectric actuators $19l, 19r$ so as to have them produce forces f of the same magnitude along the z-axis. A displacement to be developed in one of the parallel flexible-beam displacement mechanisms, say, the parallel flexible-beam displacement mechanism $22l$ will now be taken into consideration. Owing to the application of the voltage to the piezoelectric actuator 19*l*, the rigid portion 15*c* is pushed by the force f upwardly along the z-axis. Accordingly, the parallel flexible beams 16*l*, 16*l'* undergo bending deformations in the same manner as the parallel springs 2*a*,2*b* depicted in FIG. 1, whereby the rigid portion 15*c* is displaced upwardly along the z-axis. If the other parallel flexible-beam displacement mechanism 22*r* is supposed not to exist in the above case, a displacement and angular displacement (which are the above-mentioned parasitic displacements) are supposed to occur simultaneously along the x-axis and about the y-axis respectively in the rigid portion 15*c* although they are extremely small. Supposing that the parallel flexible-beam displacement mechanism 22*l* is not contained, let's think of displacements which occur in the other parallel flexible-beam displacement mechanism 22*r*. Since the parallel flexible-beam displacement mechanism 22*r* is constructed in plane symmetry relative to the parallel flexible-beam displacement mechanism 22*l* with respect to the standard plane K, the above-mentioned parasitic displacement takes place simultaneously with a displacement along the z-axis in the rigid body 15*c* in the same manner as that described above when a force f, which is in plane symmetry with respect to the standard K, is applied. The magnitude and direction of the parasitic displacement is in plane symmetry relative to the parasitic displacement of the parallel flexible-beam displacement mechanism 22*l* with respect to the standard plane K. Taking the parasitic displacements into consideration, the parasitic displacement which takes place in association with the displacement along the x-axis in the parallel flexible-beam displacement mechanism 22*l* occurs in the leftward direction as viewed in the figure, and the parasitic displacement which takes place in association with the radial displacement about the y-axis in the parallel flexible-beam displacement mechanism 22*l* occurs counterclockwise as viewed in the figure. On the other hand, the parasitic displacement which takes place in association with the displacement along the x-axis in the parallel flexible-beam displacement mechanism 22*r* occurs in the rightward direction as viewed in the figure while the parasitic displacement which takes place in association with the angular displacement about the y-axis in the parallel flexible-beam displacement mechanism 22*r* occurs clockwise as viewed in the figure. The magnitude of each displacement along the x-axis and that of each displacement about the y-axis are equal to each other. Accordingly, the parasitic displacements which occur respectively in the parallel flexible-beam displacement mechanisms 22*l*,22*r* are mutually cancelled out. As a result, the application of the force f results only in a slight increase to the internal stress of each of the parallel flexible beams 16*l*,16*l'*,16*r*,16*r'* owing to their expansions along their lengths and the rigid portion 15*c* undergoes a displacement (main displacement) $\epsilon$ along the z-axis only.

When the parallel flexible beams 16*l*,16*l'* are caused to expand and are hence bent in the above-described manner, the strain gauges 21 develop compressive or expansive strains depending on the arranged positions thereof. The still more precise main displacement $\epsilon$ can thus be obtained provided that a so-called feed back system is constructed by detecting these strains with the strain gauges 21 and controlling the voltages to be applied respectively to the piezoelectric actuators 19*l*,19*r* in accordance with the thus-detected values. The detection of strains by the strain gauges 21 has been described above on the basis of one example in which the strain gauges 21 are provided at points of connection between the parallel flexible beams 16*l*,16*l'* and their corresponding rigid portions 15*l*,15*c*. Needless to say, the strain gauges may be provided with the flexible beams 16*r*,16*r'* of the other parallel flexible-beam displacement mechanism 22*r* or may alternatively be provided at predetermined points of both parallel flexible-beam displacement mechanism 22*l*,22*r*. This also applies exactly to the subsequent embodiment.

When the voltages applied to the piezoelectric actuators 19*l*,19*r* are eliminated, the parallel flexible beams 16*l*,16*l'*,16*r*,16*r'* return to their original state before their deformations. Thus, the symmetrical parallel flexible-beam displacement mechanism 23 returns to its original state depicted in FIG. 12 and the displacement $\epsilon$ is reduced to zero (0).

Since the parallel flexible-beam structures are arranged in plane symmetry with respect to the standard plane in the present embodiment, it is possible to avoid the occurrence of parasitic displacements, to improve the accuracy of each positioning operation leapingly, and hence, to maintain the accuracy of displacements even when two or more symmetrical parallel flexible-beam displacement mechanisms are stacked to make up a multi-axis fine positioning device. Similar to the preceding embodiments, the piezoelectric actuators which are adapted to produce forces are received in the regions defined by the rigid portions and parallel flexible beams of their respective parallel flexible-beam displacement mechanisms. It is thus possible to construct the device into a simple shape without any externally-protruding portions. Owing to this structural feature, it is possible to allow forces, which have been produced by the piezoelectric actuators, to be transmitted very close to the corresponding parallel flexible beams. When such mechanisms are stacked, the above-described structure can hence solve the problem mentioned above in connection with the conventional positioning devices that actuators interfere one another. Accordingly, symmetrical parallel flexible-beam displacement mechanisms can be stacked with ease to construct a multi-axis fine positioning device. When stacked to construct a multi-axis fine positioning device, it is possible, similar to the preceding embodiments, to accurately detect displacements produced along the respective axes of the resulting multi-axis positioning mechanism based on the strains of the parallel flexible beams, which do not interfere one another, and then to control the forces to be produced by the piezoelectric actuators on the basis of the thus-detected values. It is thus feasible to improve the accuracy of each positioning operation further by the thus-stacked multi-axis positioning device, coupled with the effect of the symmetrical parallel flexible-beam displacement mechanism per se that all interference-related displacements can be avoided.

FIG. 14 is a side view of a fine positioning device according to the seventh embodiment of this invention. As apparent from the figure, the present embodiment has such a structure that two radial flexible-beam displacement mechanisms, each of the same type as the radial flexible-beam displacement mechanism 32 of the second embodiment shown in FIG. 7, are symmetrically connected together while sharing a common rigid portion, which corresponds to the rigid portion 15*b*. Thus, the elements of structure of the left-hand radial flexible-beam displacement mechanism as viewed in the figure will be represented by adding letter l to the reference numerals for the corresponding elements of structure shown in FIG. 7, while the elements of structure of the right-hand radial flexible-beam displacement mechanism will be represented by adding letter r to the reference numerals for the corresponding elements of structure shown in FIG. 7. Description on these common elements is omitted. Accordingly, description will be made on elements of structure, which are represented by different numerals. In the figure, there are shown a central rigid portion $25c$, a tongue $28c_1$ from the rigid portion $25c$ into a through-hole $27l$, and another tongue $28c_2$ extending from the rigid portion $25c$ into another through-hole $27r$. The tongues $28c_1, 28c_2$ are aligned, in a vertical direction as viewed in the figure, with further tongues $28l, 28r$ respectively with an interval therebetween. Piezoelectric actuators $29l, 29r$ are provided between the tongues $28c_1, 28l$ and between the tongues $28c_2, 28r$ respectively.

In the above structure, one of the radial flexible-beam displacement mechanisms, i.e., the radial flexible-beam displacement mechanism $32l$ is constructed by the rigid portions $25l, 25c$, radial flexible beams $26l, 26l'$, tongues $28l, 28c_1$ and piezoelectric actuator $29l$, while the other radial flexible-beam displacement mechanism $32r$ is composed of the rigid portions $25r, 25c$, radial flexible beams $26r, 26r'$, tongues $28r, 28c_2$ and piezoelectric actuator $29r$. Furthermore, the radial flexible-beam displacement mechanism $32r$ and the radial flexible-beam displacement mechanism $32l$ are in a relation of axisymmetry with respect to the crossing straight line of those planes in which the radial flexible beams $26l, 26l', 26r, 26r'$ lie. In this embodiment, the straight line is a line which passes through a point O at a right angle relative to the drawing sheet. By the radial flexible-beam displacement mechanisms $32l, 32r$ which are in a relation of axisymmetry, a symmetrical radial flexible-beam displacement mechanism 33 is constructed. The straight line also serves as a standard axis which indicates the position and the direction of installation of the symmetrical radial flexible-beam displacement mechanism 33.

The operation of this embodiment will next be described with reference to FIGS. 15 and 16. FIG. 15 is a side view of the symmetrical radial flexible-beam displacement mechanism 33 of FIG. 14 after it has been deformed. Let's now apply voltages to the piezoelectric actuators $29l, 29r$ so as to have them produce forces f of the same magnitude along their respective tangents to a circle with the center of point O. The rigid portion $28c_1$ is then pushed by the force f, which has been produced in the piezoelectric actuator $29l$, upwardly along the tangent. On the other hand, the tongue $28c_2$ is pushed by the force f, which has been produced in the piezoelectric actuator $29r$, downwardly along the tangent. Since the rigid portion $25c$ is in a form connected to both rigid portions $25l, 25r$ by way of the radial flexible beams $26l, 26l', 26r, 26r'$, as a result of the application of the above-mentioned forces, portions of the radial flexible beams $26l, 26l', 26r, 26r'$ which portions are connected to the associated rigid portions $25l, 25r$ are still allowed to remain on their corresponding straight lines $L_1, L_2$ extending radially from the point O but their remaining portions connected to the rigid portion $25c$ undergo small displacements so that they are shifted onto straight lines $L_1', L_2'$ which are slightly offset from the straight lines $L_1, L_2$ and also extend radially from the point O. Accordingly, the rigid portion $25c$ is caused to turn clockwise over a small angle $\delta$ as viewed in the figure. Since the magnitude of this angular displacement $\delta$ is determined by the rigidity of the radial flexible beams $26l, 26l', 26r, 26r'$ against bending deformations, the angular displacement $\delta$ can be controlled with the same accuracy as the force f provided that the force f is controlled precisely. This embodiment has materialized a fine positioning device equipped with the same advantages as the sixth embodiment in connection with angular displacements too, thereby permitting fine adjustments by angular displacements.

Similar to the individual parallel flexible-beam displacement mechanisms in the symmetrical parallel flexible-beam displacement mechanism in the preceding embodiment it may also be contemplated that only one of the radial flexible-beam displacement mechanisms, namely, the radial flexible-beam displacement mechanism $32l$ undergoes an angular displacement in the symmetrical radial flexible-beam displacement mechanism of this embodiment. When a voltage is applied to the piezoelectric actuator $29l$ of the individual radial flexible-beam displacement mechanism $32l$, this piezoelectric actuator $29l$ thus produces an upward force along the tangent so that the radial flexible beams $26l, 26l'$ are bent and the rigid portion $25c$ turns about the point O. This deformed state is shown by broken lines in FIG. 16, in which the tongues $28c_1, 28l$ and piezoelectric actuator $29l$ are omitted and the rigid portion $25l$ is shown in a simplified form. It should be borne in mind that the deformation is exaggerated in FIG. 16. As apparent from the figure, the point O on the rigid portion $25c$ cannot help undergoing such a parasitic displacement that it is offset to a point O' although the distance between the points O and O' is extremely small. Let's now deal with the other individual radial flexible-beam displacement mechanism $32r$ which is located at a position where it is axisymmetrical with the former radial flexible-beam displacement mechanism $32l$ relative to the standard axis. When the force f is applied to the radial flexible-beam displacement mechanism $32r$ in a direction axisymmetrical to the force f applied to the former mechanism $32l$ with respect to the standard axis, an angular displacement is also developed about the point O as a main displacement. A parasitic displacement which occurs simultaneously with the main displacement is however axisymmetrical to the aforementioned parasitic displacement with respect to the standard axis. When the radial flexible-beam displacement mechanisms $32l, 32r$ are driven at the same time, the parasitic displacement in the radial flexible-beam displacement mechanism $32l$ is cancelled out with the parasitic displacement produced in the radial flexible-beam displacement mechanism $32r$ with the same magnitude but the opposite direction. As a result, such parasitic displacements do not come out from the symmetrical radial flexible-beam displacement mechanism 33. For this reason, the symmetrical radial flexible-beam displacement mechanism 33 can obtain a more correct angular displacement $\delta$ compared with the single radial flexible-beam displacement mechanism.

Incidentally, the control of the angular displacement $\delta$ by the feed back control system making use of the strain gauges 31 can be conducted in the same manner as in the preceding embodiment. Here again, the provision of the strain gauges 31 at points of connection between the radial flexible beams $26l, 26l'$ and the rigid portions $25l, 25c$ permits correct detection of strains without any influence from other radial flexible-beam displacement mechanism or mechanisms when two or more radial flexible-beam displacement mechanisms are combined together to make up a multi-axis fine positioning device.

In the above description of the seventh embodiment, the symmetrical radial flexible-beam displacement mechanism in which the two radial flexible-beam displacement mechanisms are symmetrically provided in combination on the left and right sides respectively was described. However, it is not always required to limit the symmetrical radial flexible-beam displacement mechanism to such a horizontally symmetrical arrangement. As easily understood from the above description, it is an essential requirement that they are axisymmetrical with respect to the standard axis and a combined radial flexible-beam displacement mechanism can still exhibits similar functions even if its structure is not horizontally symmetrical.

When the voltages applied to the piezoelectric actuators $29l,29r$ are eliminated, all of the radial flexible beams $26l,26l',26r,26r'$ return to their state before their deformations, the symmetrical radial flexible-beam displacement mechanism 33 returns to its state depicted in FIG. 14, and the angular displacement $\delta$ is reduced to zero (0).

Since the radial flexible-beam displacement mechanisms are arranged in axisymmetry with respect to the standard axis in the present embodiment, it is possible to obtain angular displacements with good accuracy. For this reason, the accuracy of displacements can be maintained even when two or more symmetrical radial flexible-beam displacement mechanisms are stacked together to make up a multi-axis fine positioning device. Similar to the preceding embodiments, the piezoelectric actuators which are adapted to produce forces are received in the regions defined by the rigid portions and radial flexible beams of their respective radial flexible-beam displacement mechanisms. It is thus possible to construct the device into a simple shape without any externally-protruding portions. Owing to this structural feature, it is possible to allow forces, which have been produced by the piezoelectric actuators, to be transmitted very close to the corresponding radial flexible beams. When such mechanisms are stacked, the above-described structure can hence solve the problem mentioned above in connection with the conventional positioning devices that actuators interfere one another. Accordingly, symmetrical radial flexible-beam displacement mechanisms can be stacked with ease to construct a multi-axis fine positioning device. Similar to the preceding embodiments, produced displacements are correctly detected on the basis of strains of the radial flexible beams, which do not interfere one another even when stacked to construct a multi-axis fine positioning device, and the forces to be produced by the piezoelectric actuators are controlled on the basis of the thus-detected values. It is thus feasible to improve the accuracy of each positioning operation further by the thus-stacked multi-axis positioning device, coupled with the effect of the symmetrical radial flexible-beam displacement mechanism per se that all interference-related displacements can be avoided.

FIG. 17 is a side view of a fine positioning device according to the eighth embodiment of this invention. In the figure, the same elements of structure as those shown in FIG. 14 are designated by the same reference numerals and their description is omitted. Although the embodiment depicted in FIG. 14 employed, as a drive mechanism for producing angular displacements, the piezoelectric actuators capable of producing forces along their tangents to a circle having a center of point O, the present embodiment employs a torque producing mechanism which produces torques about a standard axis owing to the interaction between a permanent magnet and an electromagnet. In the figure, there are shown a rigid portion 35 corresponding to the rigid portion 25c depicted in FIG. 14, a shallow hole 36 formed in a side wall of the rigid portion 35, and arcuate recesses 36a provided about a standard axis and along central concave edges of the hole 36. Numerals $37l,37r$ indicate support extending from the rigid portions $25l,25r$ into the hole 36. Designated at numeral 38 is a torque producing mechanism, which is composed of exciting portions 38a and a cylindrical member 38b. The exciting portions 38a are each constructed of an exciting winding (not illustrated) arranged at a prescribed position of the rigid portion 35 along the arcuate edge of the corresponding recess 36a of the hole 36. On the other hand, the cylindrical member 38b includes two permanent magnets (not illustrated) at inner locations facing the corresponding recesses 36a, with a predetermined positional relation with the exciting windings arranged respectively in the corresponding exciting portions 38a. It should be borne in mind that the number of exciting windings may vary suitably and the number of permanent magnets may also vary correspondingly. Either lower or upper exciting portion 38a may also be omitted provided that the permanent magnet is suitably arranged in the cylindrical member 38b. Numeral 39 indicates a symmetrical radial flexible-beam displacement mechanism of this invention.

When predetermined currents are fed to the exciting windings in the exciting portions 38a, a torque is produced by attracting and repulsive forces, the magnitudes of which are proportional to the above-fed currents, between the exciting portions 38a and cylindrical member 38b. By this torque, the rigid portion 35 turns about the standard axis and for the same reasons as those mentioned in connection with the symmetrical radial flexible-beam displacement mechanism depicted in FIG. 14, each of the radial flexible beams $26l,26l',26r,26r'$ undergoes a deformation such as that illustrated in FIG. 15. Namely, the rigid portion 35 produces an angular displacement relative to the rigid portions $25l,25r$.

It is also possible to form a through-hole instead of the shallow hole, to form another through-hole at a right angle relative to the former through-hole and then to provide the torque producing mechanism at a point where both through-holes cross at a right angle. Furthermore, the torque producing mechanism is not necessarily limited to the combination of one or more permanent magnets and one or more electromagnets. It is possible, for example, to combine one or more electromagnets with one or more electromagnets or to use suitable other non-contact torque producing mechanisms. The rigid portions are the same as those of the seventh embodiment.

As described above, the torque producing mechanism is provided, as a symmetrical radial flexible-beam displacement mechanism, centrally in the central rigid portion in the present embodiment. Accordingly, this embodiment can bring about the same effects as the seventh embodiment.

In the above, the functions of the symmetrical parallel flexible-beam displacement mechanism and symmetrical radial flexible-beam displacement mechanism have been described in detail. They are devices for producing displacements along one of the three coordinate axes (x,y,z) and angular displacements about one of the three coordinate axes respectively. If a plurality of such symmetrical parallel flexible-beam displacement mechanisms are combined together with their standard axes neither coincided nor arranged in parallel, it is possible to perform fine positioning operations along two or three coordinate axes by the resulting single device. If a plurality of such symmetrical radial flexible-beam displacement mechanisms are combined together with their standard axes neither coincided nor arranged in parallel, it is possible to perform fine positioning operations with respect to angular displacements about two or three coordinate axes by the resulting single device. Furthermore, it is apparently feasible to perform fine positioning operations with respect to displacements along 1–3 coordinate axes and angular displacements about 1–3 coordinate axes by a single device provided that one or more symmetrical parallel flexible-beam displacement mechanisms and one or more symmetrical radial flexible-beam displacement mechanisms are suitably combined together. These combinations can be materialized with ease as mentioned above. In addition, the thus-combined devices have such a great advantage that no interferences occur among displacements and angular displacements of the respective symmetrical parallel flexible-beam displacement mechanisms and/or symmetrical radial flexible-beam displacement mechanisms. One embodiment of the above-mentioned combined structures will hereinafter be described using the linear drive unit 50 and angular drive unit 60 which are illustrated in FIGS. 9(a) and 9(b) respectively.

FIG. 18 is a partially cut-away perspective view of a fine positioning device according to the ninth embodiment of this invention. The device of this invention can produce displacements along three axes (x,y,z) when the coordinate axes are given as shown in the figure. In the figure, there are illustrated a cruciform columnar body 70 made of a rigid body having a cruciform transverse cross-section, a rigid portion 71 connected to the cruciform columnar body 70, and another rigid portion 72 connected also to the cruciform columnar body 70. Preferably they are integrally machined from a single piece of rigid block.

Numeral 73 indicates a first columnar body forming the cruciform columnar body 70 whereas numeral 74 indicates a second columnar body also forming the cruciform columnar body 70. The first columnar body 73 and second columnar body 74 are perpendicular to each other. The first columnar body 73 is composed of rigid portions $73a_1, 73a_2, 73b_1, 73b_2, 70c$ and linear drive units $50x, 50z$ and contains two symmetrical parallel flexible-beam displacement mechanisms. The second columnar body 74 is composed of rigid portions $74a, 74b, 70c$ and a linear drive unit $50y$, whereby a single symmetrical parallel flexible-beam displacement mechanism is constructed. The rigid portion $70c$ is a central rigid portion which both columnar bodies 73,74 share commonly. The rigid portion 71 is connected to both end rigid portions $73a_1, 73b_1$ of the first columnar body 73 (namely, is separated from the second columnar body 74), while the solid portion 72 is connected to both end rigid portions $74a, 74b$ of the second columnar body 74 (namely, is separated from the first columnar body 73). In the first columnar body 73, one of the linear drive units $50z$ which make up the symmetrical parallel flexible-beam displacement mechanisms is formed between the rigid portions $73a_1$ and $73a_2$ and the other between the rigid portions $73b_1$ and $73b_2$. On the other hand, one of the linear drive units $50x$ is formed between the rigid portions $73a_2$ and $70c$ and the other between the rigid portions $73b_2$ and $70c$. Furthermore, in the second columnar body 74, the linear drive units $50y$ which makes up the symmetrical parallel flexible-beam displacement mechanism is formed between the rigid portions $74a$ and $70c$ and the other between the rigid portions $74b$ and $70c$.

All of the standard axes of the symmetrical parallel flexible-beam displacement mechanisms constructed in the cruciform columnar body 70 pass through the center of the central rigid portion $70c$. The standard axis of the symmetrical parallel flexible-beam displacement mechanism formed of the linear drive units $50x$ is coincided with the x-axis, the standard axis of the symmetrical parallel flexible-beam displacement mechanism made up of the linear drive units $50y$ is registered with the y-axis, and the standard axis of the symmetrical parallel flexible-beam displacement mechanism formed of the linear drive units $50z$ is coincided with the z-axis. Consequently, the standard axes of the three symmetrical parallel flexible-beam displacement mechanisms constructed in the cruciform columnar body 70 are mutually perpendicular.

On the parallel flexible beams which are arranged in pairs in the linear drive units $50x, 50y, 50z$, strain gauges are arranged as shown in FIG. 12. They are however omitted in the figure because their inclusion makes the figure unduly complex (this also applies to the subsequent examples).

The operation of the present embodiment will next be described. First of all, let's assume that the two linear drive units $50z$ are driven (namely, voltages are applied to their piezoelectric actuators). As mentioned in the description of the embodiment depicted in FIG. 12, relative displacements $\epsilon_z$ then occur between the rigid portions $73a_1$ and $73a_2$ and between the rigid portions $73b_1$ and $73b_2$. Here, it should be recalled that the rigid portions $73a_1, 73b_1$ are integrally formed with the rigid portion 71 and the rigid portions $73a_2, 73b_2$ are connected to the rigid portion 72 by way of each of the linear drive unit $50x$ having sufficiently high rigidity against forces applied along the z-axis, the central rigid portion $70c$, each of the linear drive units $50y$ having sufficiently high rigidity against forces applied along the z-axis, and the rigid portions $74a, 74b$. Dealing now with a force applied along the z-axis, the rigid portions $73a_1, 73b_1$ which are located outside the corresponding linear drive units $50z$ are rigidly connected to the rigid portion 71 and the rigid portions $73a_2, 73b_2$ which are located inside the corresponding linear drive units $50z$ are rigidly connected to the rigid portion 72. When the linear drive units $50z$ are driven, the relative displacement $\epsilon_z$ is produced along the z-axis between the rigid portion 71 and rigid portion 72.

When the linear drive units $50x$ are driven in the same manner, a relative displacement $\epsilon_x$ is consequently produced along the x-axis between the rigid portion 71 and rigid portion 72 because the rigid portions $73a_2, 73b_2$ located outside the corresponding linear drive units $50x$ are rigidly connected to the rigid portion 71 by way of the linear drive units $50z$ having sufficiently high rigidity against forces applied along the x-axis and the rigid portions $73a_1$ and $73b_1$, and because the rigid portion $70c$ located inside both linear drive units $50x$ is rigidly connected to the rigid portion 72 by way of the linear drive units 50y having sufficiently high rigidity against forces applied along the x-axis and the rigid portions 74a, 74b.

When the linear drive units 50y are driven on the other hand, a relative displacement $\epsilon_y$ is consequently produced along the y-axis between the rigid portion 71 and rigid portion 72 because the rigid portion 70c located inside the linear drive units 50y is rigidly connected to the rigid portion 71 by way of the linear drive units 50x having sufficiently high rigidity against forces applied along the y-axis, the rigid portions $73a_2, 73b_2$, the linear drive units 50z having sufficiently high rigidity against force applied along the y-axis and the rigid portions $73a_1$ and $73b_1$ and the rigid portions 74a, 74b located outside their corresponding linear drive units 50y are rigidly connected to the rigid portion 72.

Thus, a three-dimensional fine positioning mechanism can be constructed, for example, if the rigid portion 72 is connected to the support table shown in FIG. 1, a coarse motion table making up a device for performing positioning operations with lower accuracy over a displacement range wider than fine motion devices incorporating the present embodiment or the like and the rigid portion 71 is connected to a fine motion table.

As apparent also from the description on the sixth embodiment, a force produced at each of the linear drive units is transmitted only through a path which is very close to the linear drive unit and the force is not transmitted through any of the other symmetrical parallel flexible-beam displacement mechanisms. The present embodiment thus has such an advantage that a displacement can basically be produced along each of the axes independently without giving any influence to displacements along the other axes. Even in such a special case that a heavy object should be placed on the fine motion table or the fine motion table is accompanied by resistance upon its fine movement, it is still possible to produce a displacement independently along each of the axes without giving any influence to displacements along the other axes and the thus-produced displacement has extremely high accuracy because as apparent from the above description on its operation, the respective symmetrical parallel flexible-beam structures are arranged with their standard axes being mutually perpendicular and the parallel flexible beams of the linear drive units in each of the symmetrical parallel flexible-beam structures have sufficiently high rigidity against forces applied along axes other than their corresponding axis. For the same reasons, the detection of strains in each of the drive units by unillustrated strain gauges can be performed without any influence from the drive units associated with the other axes and the accuracy of detection of displacements produced by the respective displacement mechanisms are extremely high.

As described above, the three symmetrical parallel flexible-beam displacement mechanisms are formed and arranged into the cruciform columnar body with their standard axes crossing at a right angle to one another in the present embodiment. The present embodiment can thus perform, with good accuracy, three-dimensional fine positioning operations. Since displacements along one axis are not interfered by displacements along another axis, a device can be fabricated with ease. Since displacements produced by the respective displacement mechanisms can be determined by the strain gauges, it is also possible to improve the accuracy of positioning operations along each axis in accordance with the feedback control method. Since the linear drive units are incorporated in their corresponding symmetrical parallel flexible-beam displacement mechanisms, there are no elements which extend outwardly. It is thus possible to construct, with ease, a three-dimensional fine positioning mechanism of a very compact shape with a cruciform columnar body. Furthermore, the device of this embodiment can be fabricated as an integral article by effecting only mechanical machining on a rigid columnar block as a raw material. It is thus possible to achieve reductions to the machining cost and the number of parts, dimensional reductions, improvements to the linearity owing to the avoidance of play and the omission of sliding parts, the elimination of hysteresis, etc.

FIGS. 19(a) and 19(b) are respectively plan and side views of a fine positioning device according to the tenth embodiment of this invention. The device of this invention can produce angular displacements about two axes (y-axis and z-axis) when the coordinate axes are established as depicted in the figure. In the figures, there are shown rigid portions 75a, 75b, thinner rigid portions 76a, 76b, and a central rigid portion 75c. Angular drive units 60z are connected respectively between the rigid portions 75c and 76a and between the rigid portions 75c and 76b, whereas angular drive units 60y are connected respectively between the rigid portions 76a and 75a and between the rigid portions 76b and 75b. The other ends of the rigid portions 75a, 75b are connected together by an unillustrated rigid structure. The respective rigid portions 75a, 75b, 75c, 76a, 76b and the individual angular drive units 60y, 60z are integrally machined from a single piece of rigid body.

Lines $L_1, L_2$ which extend through the centers of the radial flexible beams of the respective angular drive units 60z cross at an angle $\theta_2$ on the standard axis of the angular drive units 60z. The standard axis passes through a point 0 of the rigid portion 75c in a direction perpendicular to the drawing sheet. On the other hand, lines $L_3, L_4$ which extend through the centers of the radial flexible beams of the respective angular drive units 60y cross at an angle $\theta_1$ on the standard axis of the angular drive units 60y. In the device of this embodiment, the symmetrical radial flexible-beam displacement mechanism for producing angular displacements about the y-axis and the symmetrical radial flexible-beam displacement mechanism for producing angular displacements about the z-axis are integrally combined together.

The operation of the present embodiment will next be described. When the two angular drive units 60z are driven, a relative angular displacement $\delta_z$ is produced about the z-axis between the rigid portions 76a, 76b and the rigid portion 75c as mentioned in the description on the embodiment depicted in FIG. 14. Although the thicknesses of the rigid portions 76a, 76b are small, the rigid portions 76a, 76b exhibit sufficiently-high rigidity against each torque about the z-axis because the angular drive units 60y, which are immediately adjacent to the rigid portions 76a, 76b respectively, have sufficiently high rigidity against each torque about the z-axis. Namely, dealing with a torque about the z-axis, the portions outside the angular drive unit 60z (namely, on the opposite sides to the rigid portion 75c) is considered to be rigidly connected to the rigid portions 75a, 75b notwithstanding the interposition of the thin rigid portions 6a, 76b and angular drive units 60y. When the angular drive units 60z are driven, the relative angular displacement δz is hence produced about the z-axis between the central rigid portion 75c and the rigid portions 75a,75b.

In the same token, when the angular drive unit 60y is driven, a relative angular displacement δy is produced about the y-axis between the central rigid portion 75c and the rigid portions 75a,75b because the angular drive unit 60z has sufficiently high rigidity compared with the rigid portions 76a,76b and the angular drive unit 60y and central rigid portion 75c are hence considered to be connected rigidly.

As also understood from the description on the seventh embodiment, a force applied at each of the angular drive units to produce a torque is transmitted only through a path which is very close to the angular drive unit and the force is not transmitted through any of the other symmetrical radial flexible-beam displacement mechanisms. The present embodiment thus has such an advantage that a displacement can be produced along each of the axes independently without giving any influence to displacements about the other axes in the same manner as the ninth embodiment. Even in such a special case that a heavy object should be placed on the fine motion table or the fine motion table is accompanied by resistance upon its fine movement, it is still possible to produce an angular displacement independently about each of the axes without giving any influence to angular displacements about the other axes and the thus-produced displacement has extremely high accuracy because as apparent from the above description on its operation, the respective symmetrical radial flexible-beam structures are arranged with their standard axes being mutually perpendicular and the radial flexible beams of the angular drive units in each of the symmetrical radial flexible-beam mechanisms have sufficiently high rigidity against torques about axes other than their corresponding axis. For the same reasons, it is effective to make corrections on the basis of the detection of strains by unillustrated strain gauges.

A device capable of producing three-dimensional angular displacements can apparently be constructed if a further set of angular drive unit, which is adapted to produce angular displacements about the x-axis, is added to the structure of the present embodiment.

As has been described above, the present embodiment is constructed by combining two symmetrical radial flexible-beam structures together with their standard axes extending at a right angle relative to each other. The present embodiment can thus produce two-dimensional angular displacements with good accuracy. The device of this embodiment can also be constructed with ease because angular displacements produced about one axis do not interfere those produced about the other axis and vice versa. The feed back control making use of strain gauges, the incorporation of the angular drive units within the corresponding symmetrical radial flexible-beam displacement mechanisms and the structurally-integral nature of the device can respectively bring about the same effects as those mentioned with respect to the preceding ninth embodiment.

FIGS. 20(a) and 20(b) are perspective views of a fine positioning device according to the eleventh embodiment of this invention. The device of this embodiment can produce displacements along the three axes (x,y,z) when the coordinate axes are established as illustrated in the figures. In this respect, the device of this embodiment is similar to the device of the ninth embodiment depicted in FIG. 18. However, the linear drive unit 50z for the z-axis is arranged and constructed in a different manner. In FIG. 20(a), there are shown a cruciform columnar body 80 formed substantially with a cruciform transverse cross-section, a first columnar body 81 forming the cruciform columnar body 80 and a second columnar body 82 also forming the cruciform columnar body 80. The first columnar body 81 and second columnar body 82 are mutually perpendicular. The first columnar body 81 forms a symmetrical parallel flexible-beam displacement mechanism the standard axis of which is coincided with the x-axis. Its two linear drive units 50x are also shown in the figure. On the other hand, the second columnar body 82 forms another symmetrical parallel flexible-beam displacement mechanism the standard axis of which is coincided with the y-axis. Its two linear drive units 50y are also shown in the figure. Numerals 83a,83b,83c,83d indicate rigid intermediate portions formed respectively between the first columnar body 81 and second columnar body 82. Designated at numeral 84 is a central through-hole bored about the crossing point between the central axes of the first and second columnar bodies 81,82, with a suitable diameter and along the z-axis. Numerals 85a,85b,85c,85d indicate respectively side through-holes extending through the respective intermediate portions 83a,83b,83c,83d from the outer walls thereof to the central through-hole 84. The side through-holes 85a,85b,85c,85d are formed in such directions that they are mutually perpendicular. Owing to the formation of the respective side through-holes 85a,85b,85c,85d in the above-mentioned manner, parallel flexible beams are formed in each of the intermediate portions 83a,83b,83c,83d at both upper and lower extremities thereof as viewed in the figure. In these side through-holes, linear drive units 50z are provided all in parallel with the z-axis. Similar to the ninth embodiment shown in FIG. 18, the both ends of the rigid columnar body 81 are connected together by another rigid structure while the both ends of the rigid columnar body 82 are also connected together by a further rigid structure.

The operation of the device of this embodiment will next be described with reference to FIG. 20(b). When the linear drive units 50x are driven, a relative displacement is produced along the x-axis between the rigid portions located on the side of the central through-hole 84 with respect to the linear drive units 50x and the outer rigid portions located on the opposite sides. Since all of the linear drive units 50y and linear drive units 50z have sufficiently high rigidity against forces applied along the x-axis, they can also be considered as rigid portions. When the linear drive units 50y are driven, a relative displacement is produced between the rigid portion located on the side of the central through-hole 84 with respect to the linear drive units 50y and the outer rigid portions located on the opposite sides. Here again, the linear drive units 50x and linear drive units 50z can be considered as rigid portions because they have sufficiently high rigidity against forces applied along the y-axis.

When the linear drive units 50z are respectively driven, relative displacements $\epsilon_z$ occur, as illustrated in FIG. 20(b), along the z-axis between the first columnar body 81 and its adjacent rigid intermediate portions as well as between the second columnar body 82 and its adjacent rigid intermediate portions respectively. In order to facilitate the understanding, FIG. 20(b) illustrates that the device before its deformation, which is depicted in FIG. 20(a), has been deformed by the drive of all the linear drive units 50z from its original configurations indicated by broken lines to those shown by solid lines as indicated by small arrows. Even when such relative displacement $\epsilon_z$ along the z-axis, the linear drive units $50x,50y$ can still be considered to be rigid portions since they have sufficiently high rigidity against forces applied along the z-axis.

In the present embodiment, the central part of the cruciform columnar body 80, namely, the part connected to the linear drive units $50x,50y$ cannot be said to be rigid against all loads because the linear drive units $50z$ are formed there. However, as apparent from the above explanation too, it can be considered as a rigid portion against forces applied in the directions of displacements of the linear drive units $50x,50y$. Therefore, it can still produce intended displacements. This part can thus be called "a semi-rigid structure".

Here, this embodiment is compared with the ninth embodiment depicted in FIG. 18. In the ninth embodiment, the linear drive units $50x,50z$ are incorporated in pairs in the first columnar body 73 which extends along the y-axis. From the viewpoint for stacking drive members as close as possible, the device of the ninth embodiment does not make full use of its space because compared with the first columnar body 73, only one set of linear drive units $50y$ are incorporated in the second columnar body 74. From the viewpoint of axisymmetry with respect to the z-axis, the first columnar body 73 and second columnar body 74 have different rigidity levels (in other words, the rigidity along the x-axis is different from that along the y-axis). This difference gives undesirable effects to small deformations to be developed at different portions of the device, although such effects are extremely small. Different from the ninth embodiment, the device of this embodiment makes effective use of its space and has perfect axisymmetry with respect to the z-axis. It is thus free of the above-mentioned undesirable effects, resulting in an improvement to its accuracy.

Discussion will next be made on the arrangement and effects of the parallel flexible-beam displacement mechanisms which constitute the linear drive units $50z$ for the z-axis in FIG. 20(a). As apparent from the figure, the parallel flexible-beam displacement mechanisms which are located at four points are in a plane symmetry with respect to the x-z plane and y-z plane. Accordingly, when the flexible beams undergo bending deformations by forces applied from the piezoelectric actuators in the corresponding linear drive units $50z$, parasitic displacements which would come out if discrete parallel flexible-beam displacement mechanisms were employed are completely cancelled out among these four sets of parallel flexible-beam displacement mechanisms. Thus, the device of this embodiment has the same effects as those mentioned above with respect to the sixth embodiment. Incidentally, the standard axis of the symmetrical parallel flexible-beam displacement mechanism is coincided with the z-axis.

As mentioned above, the three symmetrical parallel flexible-beam displacement mechanisms are constructed and arranged substantially in the form of a cruciform columnar body so that their standard axes extend at a right angle relative to one another. Moreover, each of the parallel flexible-beam displacement mechanisms is of a structure having plane symmetry. Thus, the device of this embodiment can exhibit the same effects as the device of the ninth embodiment. It is also expected to achieve fine positioning operations with good accuracy. At the same time, it can avoid the wasting of space and can reduce its overall size.

Figure 21:
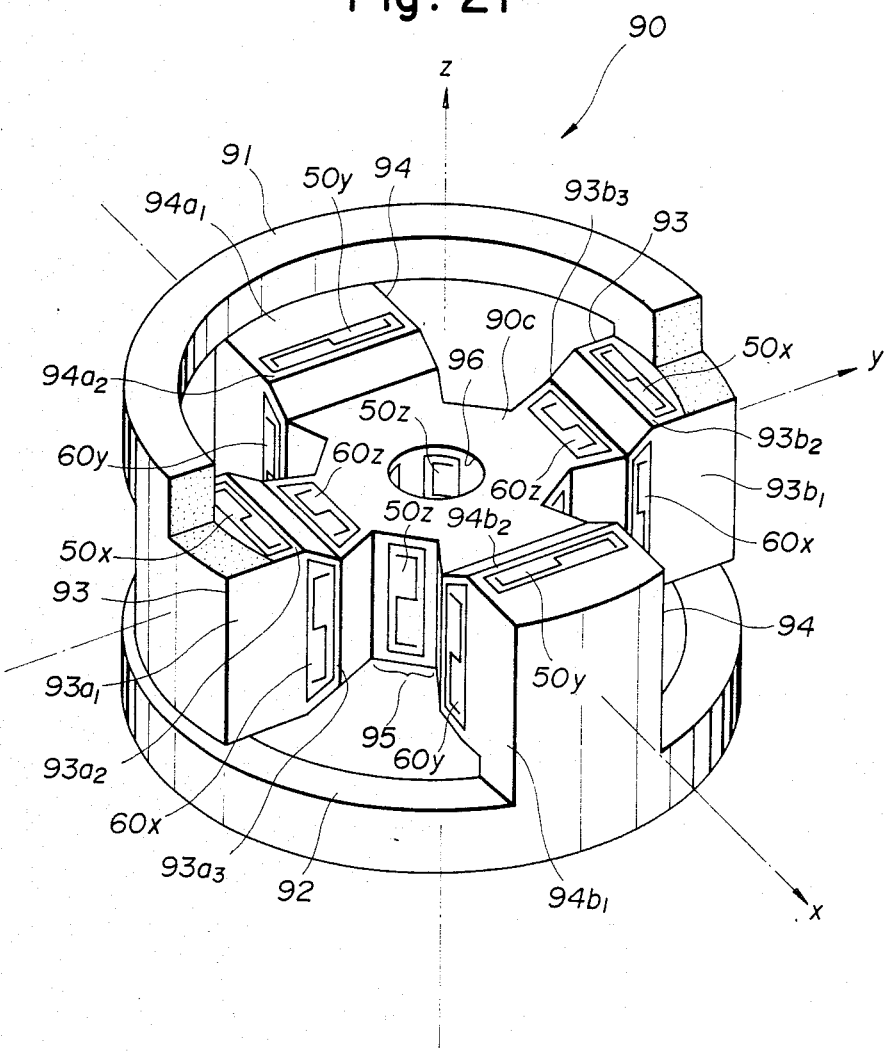
Figure 22:
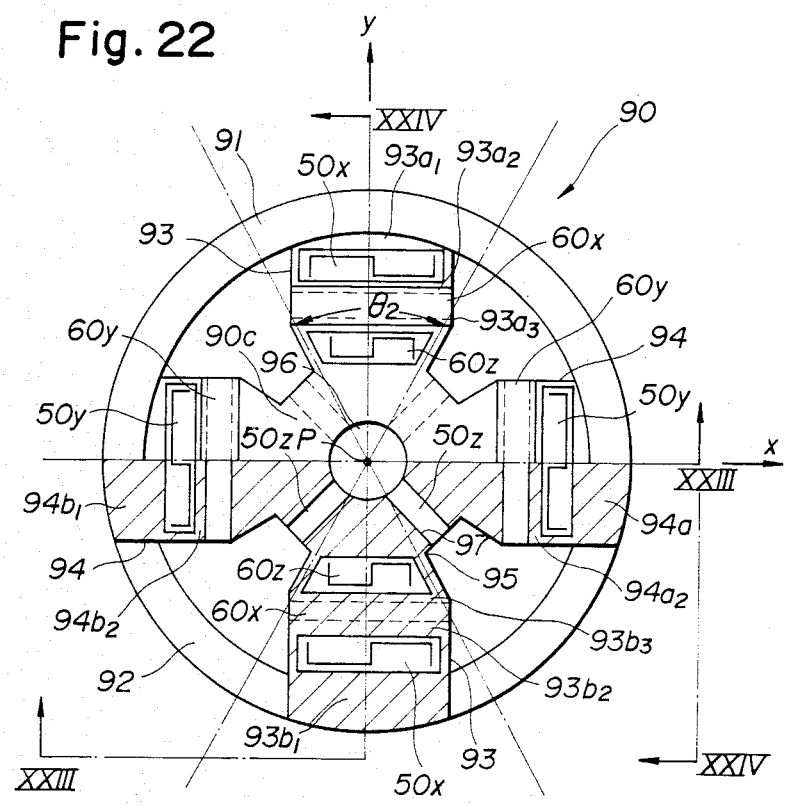
Figure 23:
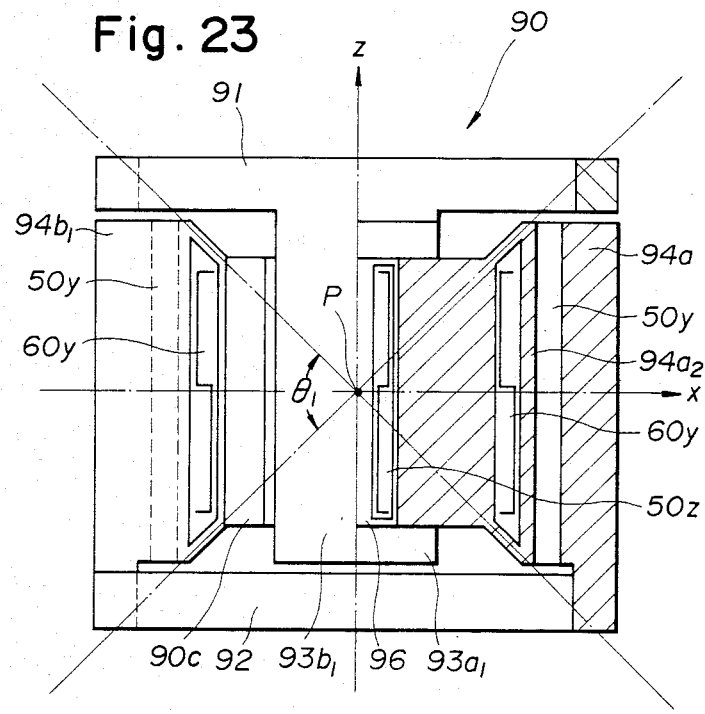
Figure 24:
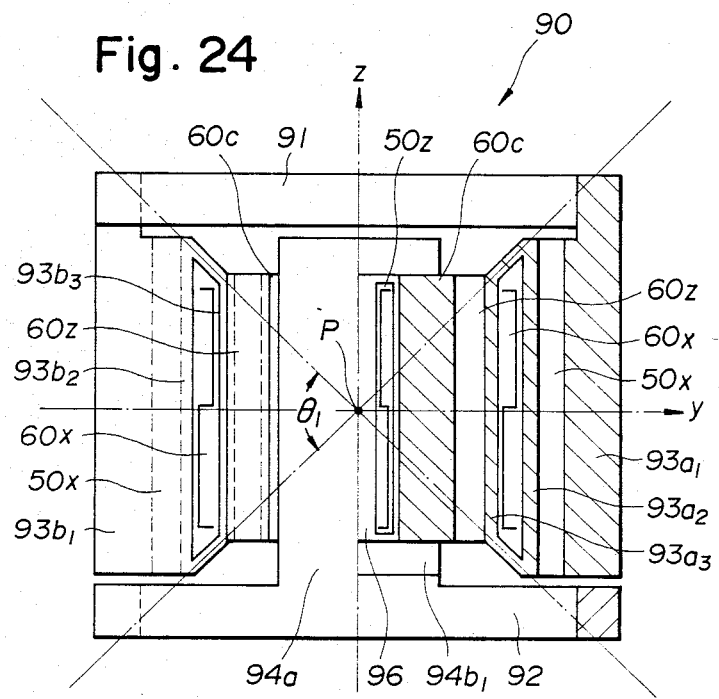

FIG. 21 through FIG. 24 show a fine positioning device according to the twelfth embodiment of this invention, in which FIG. 21 is its perspective view, FIG. 22 its partially cross-sectional plan view, FIG. 23 its partially cross-sectional side view taken along line XXIII—XXIII of FIG. 22 and FIG. 24 its partially cross-sectional side view taken along line XXIV—XXIV of FIG. 22. When the coordinate axes are established as shown in the figure, the device of this embodiment can produce displacements and angular displacements with respect to the three axes (x,y,z) and has a structure obtained by suitably combining the structures depicted respectively in FIGS. 18, 19(a), 19(b) and 20(a). In each of the figures, numeral 90 indicates a rigid cruciform columnar body formed substantially in a cruciform, numeral 91 a rigid portion connected to the cruciform columnar body 90, and numeral 92 another rigid portion connected also to the cruciform columnar body 90. They are integrally machined from of a single piece of rigid block.

Numeral 93 indicates a first columnar body which forms the cruciform columnar body 90 and extends along the y-axis, while numeral 94 indicates a second columnar body which also forms the cruciform columnar body 90 and extends along the x-axis. They share a semi-rigid structure 90c which is rigid against all forces other than those applied along z-axis. The first columnar body 93 is composed of rigid portions $93a_1,93a_2,93a_3,93b_1,93b_2,93b_3$, the semi-rigid structure 90c, the linear drive units $50x$ and the angular drive units $60x,60z$, and includes one symmetrical parallel flexible-beam displacement mechanism and two symmetrical radial flexible-beam displacement mechanisms. The second columnar body 94 is in turn composed of rigid portions $94a_1,94a_2,94b_1,94b_2$, the semi-rigid structure 90c, the linear drive units $50y$ and the angular drive units $60y$, and includes one symmetrical parallel flexible-beam displacement mechanism and one symmetrical radial flexible-beam displacement mechanism. The rigid portion 91 is integrally connected to the both end rigid portions $93a_1,93b_1$ (but separated from the second columnar body 94), while the rigid portion 92 is integrally connected to the both end rigid portions $94a_1,94b_1$ of the second columnar body 94 (but separated from the first columnar body 93).

Here, the arrangement of the linear drive units and angular drive units in the first and second columnar bodies 93,94 is described. In the first columnar body 93, one of the linear drive units $50x$ which constitute the symmetrical parallel flexible-beam displacement mechanism is formed between the rigid portions $93a_1$ and $93a_2$, while the other linear drive unit $50x$ is formed between the rigid portions $93b_1$ and $93b_2$. On the other hand, one of the angular drive units $60x$ which constitute the symmetrical radial flexible-beam displacement mechanism is formed between the rigid portions $93a_2$ and $93a_3$ and the other angular drive unit $60x$ is formed between the rigid portions $93b_2$ and $93b_3$. Furthermore, one of the angular drive units $60z$ which constitute the symmetrical radial flexible-beam displacement mechanism is formed between the rigid portions $93a_3$ and semi-rigid structure 90c and the other angular drive unit $60z$ is formed between the rigid portion $93b_3$ semi-rigid structure 90c. In the second columnar body 94, one of the linear drive units $50y$ which constitute the symmetrical parallel flexible-beam displacement mechanism is formed between the rigid portions 94$a_1$ and 94$a_2$ and the other linear drive unit 50$y$ is formed between the rigid portions 94$b_1$ and 94$b_2$, and one of the angular drive units 60$y$ which constitute the symmetrical radial flexible-beam displacement mechanism is formed between the rigid portions 94$a_2$ and semi-rigid structure 90$c$ and the other angular drive unit 60$y$ is formed between the rigid portion 94$b_2$ and semi-rigid structure 90$c$.

Description will next be made on the structure of the semi-rigid structure 90$c$. Numeral 95 indicates four intermediate portions which are located between the first columnar body 93 and second columnar body 94. Designated at numeral 96 is a central through-hole bored centrally through the semi-rigid structure 90$c$, along the z-axis and with a suitable diameter. Numeral 97 (see, FIG. 22) indicates side through-holes bored respectively through the intermediate portions 95 from the outside to the central through-hole 96. These side through-holes 97 are thus formed toward the z-axis. The linear drive units 50$z$ are respectively provided within these side through-holes 97.

In the above structure, the standard axes of the individual symmetrical parallel flexible-beam displacement mechanisms which are respectively formed of the linear drive units 50$x$,50$y$,50$z$ are coincided respectively with the x-axis, y-axis and z-axis which are mutually perpendicular. On the other hand, the standard axes of the individual symmetrical radial flexible-beam displacement mechanisms which are composed respectively of the angular drive units 60$x$, 60$y$,60$z$ are also coincided respectively with the x-axis, y-axis and z-axis which are mutually perpendicular.

In the figures, letter P indicates the crossing point among the x-axis, y-axis and z-axis, $\theta_1$ the opening angle between the associated radial flexible beams in each of the angular drive units 60$x$, 60$y$, and $\theta_2$ the opening angle between the associated radial flexible beams in each of the angular drive units 60$z$.

The operation of the device of this embodiment will next be described. Since its operation is similar to the operations of the devices depicted respectively in FIGS. 18, 19($a$), 19($b$) and 20($a$), the description will be limited to its operation when the angular drive units 60$x$ in the first columnar body 93 are driven by way of example. When the angular drive units 60$x$ are driven, a relative angular displacement is produced about the x-axis between the rigid portion 93$a_2$ (93$b_2$) and the rigid portion 93$a_3$ (93$b_3$). However, the linear drive units 50$x$ have sufficiently high rigidity against torques applied about the x-axis. Thus, the rigid portion 93$a_2$ (93$b_2$) is considered to be connected rigidly to the rigid portion 91 by way of the associated linear drive unit 50$x$ and rigid portion 93$a_1$ (93$b_1$). On the other hand, the rigid portion 93$a_3$ (93$b_3$) is also considered to be rigidly connected to the rigid portion 92 by way of the associated angular drive unit 60$z$, semi-rigid structure 90$c$, angular drive unit 60$y$, rigid portion 94$a_1$ (94$b_2$), linear drive unit 50$y$ and rigid portion 94$b_1$ since the associated angular drive unit 60$z$, semi-rigid structure 90$c$ and the associated angular drive unit 60$y$ and linear drive unit 50$y$ provided in the second columnar body 94 also have sufficiently high rigidity against torques applied about the x-axis. Consequently, a relative angular displacement $\delta_x$ is produced between the rigid portion 91 and rigid portion 92 when the angular drive units 60$x$ are driven.

Since similar operations also take place when the other linear drive units and angular drive units are driven, the device of this embodiment can independently produce displacements along the respective axes and angular displacements about the respective axes. For example, when the rigid portion 92 is fixed on the support table shown in FIG. 1, a coarse motion table or the like and a fine motion table is fixed to the rigid portion 91, a high-accuracy fine positioning mechanism capable of producing three-dimensional displacements and three-dimensional angular displacements can be constructed.

When two or more angular displacement mechanisms are incorporated for two or more axes as in the present embodiment, the center P of rotation of each angular displacement mechanism serves as the central portion of the entire fine positioning device. In this case, it is only necessary to design the device in such a way that a certain standard point specified on the fine motion table is coincided with the center of rotation. However, significant limitations are imposed on the size, arrangement and the like of the fine motion table in order to accept the above design. Such limitations may develop practical problems. In the description of the above embodiment, the fine motion table was fixed to the rigid portion 91 by way of example. The simplest structure is to use the rigid portion 91 as a fine motion table itself. However, this structure develops interference of displacements due to certain geometrical reasons. This will next be described with reference to FIG. 25.

Figure 25:
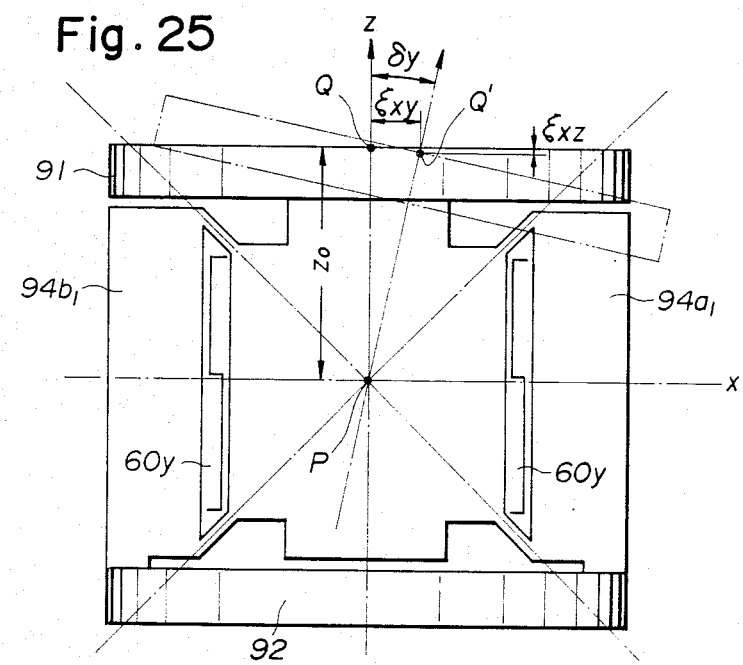

FIG. 25 is a simplified side view corresponding to FIG. 23. In the figure, the elements of structure which are required for the following discussion are solely designated by the same reference numerals as those employed in FIG. 23. Let's now assume that the rigid portion 92 is fixed and the angular drive units 60$y$ are driven. Then, an angular displacement $\delta_y$ occurs about the point P. In order to facilitate the understanding, the angular displacement $\delta_y$ is shown on a substantially enlarged scale, the rigid portion 91 is by itself used as a fine motion table, and a point Q on the surface of the rigid portion 91 is designated as the standard point. In association with the above-mentioned angular displacement $\delta_y$, the point Q undergoes the following displacements $\epsilon_{xy},\epsilon_{zy}$ respectively along the x- and z-axes:

$$\epsilon_{xy}=Z_o\sin \delta_y$$

$$\epsilon_{zy}=-Z_o(1-\cos \epsilon_y)$$

where $Z_o$ means the distance along the z-axis between the point P and point Q. In the same manner, in association with each angular displacement about the x-axis, the following displacements $\epsilon_{yx},\epsilon_{zx}$ take place respectively along the y- and z-axes:

$$\epsilon_{yx}=-Z_o\sin \delta_x$$

$$\epsilon_{zx}=-Z_o(1-\cos \delta_x)$$

These displacements occur for purely geometrical reasons due to the existence of the distance $Z_o$. They are thus totally different in nature from the above-mentioned parasitic displacements. Since the exact value for the distance $Z_o$ has already been known, it is possible to remove such interference of displacements easily and hence to perform fine positioning operations without impairing its high accuracy at all provided that inputs corresponding respectively to the below-defined displacements $\epsilon_{xo'},\ \epsilon_{yo'},\epsilon_{zo'},\delta_{xo'},\delta_{yo'},\delta_{zo'}$ are made to their corresponding displacement mechanisms to have the fine motion table undergo desired displacements $\epsilon_{xo}, \epsilon_{yo}, \epsilon_{zo}, \delta_{xo}, \delta_{yo}, \delta_{zo}$.

$$\epsilon_{xo}' = \epsilon_{xo} + \epsilon_{xy} = \epsilon_{xo} + Z_0 \sin \delta_{yo}$$

$$\epsilon_{yo}' = \epsilon_{yo} + \epsilon_{yx} = \epsilon_{yo} - Z_0 \sin \delta_{xo}$$

$$\epsilon_{zo}' = \epsilon_{zo} + \epsilon_{zx} + \epsilon_{zy}$$

$$= \epsilon_{zo} - Z_0(2 - \cos \delta_{xo} - \cos \delta_{yo})$$

$$\delta_{xo}' = \delta_{xo}$$

$$\delta_{yo}' = \delta_{yo}$$

$$\delta_{zo}' = \delta_{zo}$$

The above operation is also feasible with the tenth embodiment.

As described above, the three symmetrical parallel flexible-beam displacement mechanisms and three symmetrical radial flexible-beam displacement mechanisms, the standard axes of which are coincided respectively with the mutually-perpendicular three axes, are constructed and arranged in the form of a cruciform columnar body in the present embodiment. It is thus possible to perform highly-accurate positioning operations with respect to three-dimensional displacements and three-dimensional angular displacements. It is also possible to construct the device with ease. The feed back control making use of strain gauges, the incorporation of the linear drive units and angular drive units and the structurally-integral nature of the device can respectively bring about the same effects as those mentioned with respect to the previous ninth embodiment.

Preferred embodiments of this invention have been described above. All of these embodiments relate to fine positioning devices. In this sense, the above-given embodiments are consistent with the title of the present invention. It should however be borne in mind that the term "fine positioning device" as used herein means a device adapted to produce fine displacements and/or fine angular displacements. Nevertheless, the fine positioning devices were dealt with in the above embodiments because the the field of positioning devices is considered to be a typical application field for the present invention and such positioning devices are believed to be able to show the details of the present invention in a most simple and direct manner. Therefore, the utility of the present invention should not be limited to positioning devices. As illustrative application fields other than positioning devices, may be mentioned apparatus for deforming certain samples to have them undergo desired small displacements only so that the degrees of displacements at their contacted areas and certain property changes of the samples are investigated, and loading apparatus adapted to apply loads within small displacement ranges such as those employed for applying precise loads to single crystals along desired crystallographic axes.

When a fine positioning device is actually used, an object, which is light and does not produce resistance upon its movement, such as silicon wafer, optical fiber or specimen to be examined by a micrograph is usually placed or attached in its fine positioning area. In this case, the individual rigid portions and interposed drive units of the device are not required to have any particularly-large rigidity because no special forces and/or torques are applied to them. When used for an object different from the above-mentioned one, it develops resistance in association with a small displacement. Thus, all the rigid portions and interposed drive units are required to be rigid against forces or torques applied in a specific direction or displacements. This requirement is satisfied in all the embodiments of this invention. Hence, they are constructed in such a way that they can be successfully used as apparatus for applying loads.

Turning to the standard axes, the standard axes were mutually perpendicular in each of the stacked forms of the third embodiment and its subsequent embodiments. Needless to say, the standard axes are not absolutely required to extend at a right angle relative to one another.

In each of the above embodiments, paired flexible beams were described by way of example as parallel flexible beams or radial flexible beams. It is not absolutely necessary to limit each parallel or radial flexible beam structure to that constructed of two flexible beams. Such a parallel or radial flexible beam structure may apparently be constructed by using more than two, i.e., 3 or more flexible beams in combination. Furthermore, as parallel flexible beams and radial flexible beams, planar or plate-like beams having the same thickness were described by way of example. It is not absolutely necessary to limit them to those having equal thickness. Their thicknesses may be chosen from a variety of dimensions in view of the shape, machining and the like of through-holes to be bored through rigid blocks for the formation of parallel flexible beams and/or radial flexible beams. For this reason, it is possible to use parallel and/or radial flexible beams having uneven thicknesses.

Piezoelectric actuators were, by way of example, referred to as actuators in the description of the above embodiments. The actuators are not necessarily limited to piezoelectric actuators. Solenoids and other suitable means may also be used.

In the description of the above embodiments, each fine positioning device was formed, as the most ideal embodiment, as an integral unit from a single piece of rigid block. Individual parts which have been formed as discrete members may however be rigidly connected together by means of such members as bolts or by virtue of welding.

Although strain gauges have been referred to by way of example as means for detecting displacements of flexible beams, other means such as laser interferometers or differential transformers may also be mentioned as such detection means. Needless to say, these other means may be equally applied. However, such other means typified by laser interferometers are all not only costly but also accompanied by extreme difficulties upon their mounting on fine positioning devices and their adjustment (in the case of laser interferometers for instance, the mounting of their mirrors and the adjustment of their mounted angles). Unlike such other detection means, strain gauges are very economical and moreover, can be easily applied to flexible-beams of this invention, do not require fine adjustment, and are thus most suitable detection means, because the flexible-beams of this invention have enough space to mount strain gauges thereon and can develop suitable stress distribution which changes continuously. It should also be borne in mind that a feed back control system including such strain detection means is not absolutely required. It is apparent that fine displacements and/or fine angular displacements can still be obtained with fully satisfactory accuracy without need for such a feed back control system.

Having now fully described the invention, it will be apparent to one of ordinary skill in the art that many changes and modifications can be made thereto without departing from the spirit or scope of the invention as set forth herein.

We claim:

1. A fine positioning device characterized in that said device is equipped with at least one parallel flexible-beam displacement mechanism composed of a first rigid portion rigid against forces at least in one specific direction, a second rigid portion opposing to the first rigid portion and being rigid against forces at least in the same specific direction as above, plural flexible beams connecting the first rigid portion and the opposing second rigid portion to each other and arranged in parallel to each other or one another, and a first actuator mounted within the region surrounded by the first rigid portion, the second rigid portion and desired two of the plural flexible beams and adapted to have the plural flexible beam undergo bending deformation.

2. A fine positioning device according to claim 1, wherein one or more of the plural flexible beams, which are arranged in parallel, are equipped with detection means for detecting a relative displacement to be developed between the first rigid portion and second rigid portion.

3. A fine positioning device according to claim 2, wherein the detection means is a strain gauge.

4. A fine positioning device according to claim 1, wherein the parallel-arranged plural flexible beams, first rigid portion and second rigid portion are machined from a single rigid block.

5. A fine positioning device according to claim 1, wherein the parallel-arranged plural flexible beams, first rigid portion and second rigid portion are rigidly connected together by connector means.

6. A fine positioning device according to claim 1, wherein the first and second actuators are each composed of a piezoelectric element.

7. A fine positioning device according to claim 1, wherein a plurality of parallel flexible-beam displacement mechanisms are each provided with a standard axis extending in a different direction.

8. A fine positioning device according to claim 7, wherein each parallel flexible-beam displacement mechanism is formed in the first or second rigid portion of other parallel flexible-beam displacement mechanisms.

9. A fine positioning device according to claim 7, wherein all the parallel flexible-beam displacement mechanisms are integrally formed substantially in a cruciform pattern while sharing a common rigid portion as the first rigid portions thereof.

10. A fine positioning device characterized in that said device is equipped with at least one radial flexible-beam displacement mechanism composed of a third rigid portion rigid against torques at least around one specific axis, a fourth rigid portion opposing to the third rigid portion and being rigid against torques at least around the same axis as above, plural flexible beams connecting the third rigid portion and the opposing fourth rigid portion to each other and arranged radially relative to a specific axis, and a second actuator mounted within the region surrounded by the third rigid portion, the fourth rigid portion and desired two of the plural flexible beams and adapted to have the plural flexible beams undergo bending deformation.

11. A fine positioning device according to claim 10, wherein one or more of the plural flexible beams, which are arranged radially, are equipped with detection means for detecting a relative angular displacement to be developed between the third rigid portion and fourth rigid portion.

12. A fine positioning device according to claim 11, wherein the detection means is a strain gauge.

13. A fine positioning device according to claim 10, wherein the radially-arranged plural flexible beams, third rigid portion and fourth rigid portion are machined from a single rigid block.

14. A fine positioning device according to claim 10, wherein the radially-arranged plural flexible beams, third rigid portion and fourth rigid portion are rigidly connected together by connector means.

15. A fine positioning device according to claim 10, wherein a plurality of radial flexible-beam displacement mechanisms are each provided with a standard axis extending in a different direction.

16. A fine positioning device according to claim 15, wherein each radial flexible-beam displacement mechanism is formed in the third or fourth rigid portion of other radial flexible-beam displacement mechanisms.

17. A fine positioning device according to claim 15, comprising three radial flexible-beam mechanisms in which one standard axis is perpendicular to a plane on which an object can be mounted, and the other two standard axes intersect at right angles the first-mentioned standard axis at one point thereof and are perpendicular to each other.

18. A fine positioning device according to claim 10, wherein the first and second actuators are each composed of a piezoelectric element.

19. A fine positioning device characterized in that said device is equipped with at least one parallel flexible-beam displacement mechanism composed of a first rigid portion rigid against forces at least in one specific direction, a second rigid portion opposing to the first rigid portion and being rigid against forces at least in the same specific direction as above, plural flexible beams connecting the first rigid portion and the opposing second rigid portion to each other and arranged in parallel to each other or one another, and a first actuator mounted within the region surrounded by the first rigid portion, the second rigid portion and desired two of the plural flexible beams and adapted to have the plural flexible beams undergo bending deformation; and at least one radial flexible-beam displacement mechanism composed of a third rigid portion rigid against torques at least around one specific axis, a fourth rigid portion opposing to the third rigid portion and being rigid against torques at least around the same axis as above, plural flexible beams connecting the third rigid portion and the opposing fourth rigid portion to each other and arranged radially relative to a specific axis, and a second actuator mounted within the region surrounded by the third rigid portion, the fourth rigid portion and disired two of the plural flexible beams and adapted to have the plural flexible beams undergo bending deformation.

20. A fine positioning device according to claim 19, wherein said device is equipped with one or more parallel flexible-beam displacement mechanisms and one or more radial flexible-beam displacement mechanisms, and the standard axes of the flexible-beam displacement mechanisms of the same type extend in different directions.

21. A fine positioning device according to claim 20, wherein the one or more parallel flexible-beam displacement mechanisms and one or more radial flexible-beam displacement mechanisms are integrally formed substantially in a cruciform pattern while sharing a common rigid portion as the first and third rigid portions thereof.

22. A fine positioning device according to claim 19, wherein one or more of the plural flexible beams, which are arranged in parallel, are equipped with detection means for detecting a relative displacement to be developed between the first rigid portion and second rigid portion.

23. A fine positioning device according to claim 22, wherein the detection means is a strain gauge.

24. A fine positioning device according to claim 19, wherein the parallel-arranged plural flexible beams, first rigid portion and second rigid portion are machined from a single rigid block.

25. A fine positioning device according to claim 19, wherein the parallel-arranged plural flexible beams, first rigid portion and second rigid protion are rigidly connected together by connector means.

26. A fine positioning device according to claim 19, wherein the first and second actuators are each composed of a piezoelectric element.

* * * * *